US012213302B2

(12) United States Patent
Lee et al.

(10) Patent No.: US 12,213,302 B2
(45) Date of Patent: Jan. 28, 2025

(54) SEMICONDUCTOR MEMORY DEVICE

(71) Applicant: SAMSUNG ELECTRONICS CO., LTD., Suwon-si (KR)

(72) Inventors: Kyunghwan Lee, Seoul (KR); Yongseok Kim, Suwon-si (KR); Ilgweon Kim, Hwaseong-si (KR); Hyeoungwon Seo, Yongin-si (KR); Sungwon Yoo, Hwaseong-si (KR); Jaeho Hong, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 465 days.

(21) Appl. No.: 17/725,069

(22) Filed: Apr. 20, 2022

(65) Prior Publication Data

US 2022/0352170 A1    Nov. 3, 2022

(30) Foreign Application Priority Data

Apr. 29, 2021 (KR) ........................ 10-2021-0055949

(51) Int. Cl.
*H10B 12/00* (2023.01)
(52) U.S. Cl.
CPC ............ *H10B 12/30* (2023.02); *H10B 12/03* (2023.02); *H10B 12/05* (2023.02)
(58) Field of Classification Search
CPC ........ H10B 12/03; H10B 12/05; H10B 12/30; H01L 28/60; H01L 28/86
See application file for complete search history.

(56) References Cited

U.S. PATENT DOCUMENTS

| 9,721,831 | B2 | 8/2017 | Nien et al. |
| 9,997,592 | B2 | 6/2018 | Komeda |
| 10,607,994 | B2 | 3/2020 | Derner et al. |
| 10,804,273 | B2 | 10/2020 | Ramaswamy |
| 11,532,669 | B2 | 12/2022 | Hwu et al. |
| 2015/0333117 | A1 | 11/2015 | Sako et al. |

(Continued)

FOREIGN PATENT DOCUMENTS

| CN | 111466026 A | 7/2020 |
| KR | 20070010295 A | 1/2007 |

(Continued)

*Primary Examiner* — Michelle Mandala
*Assistant Examiner* — Kevin Quinto
(74) *Attorney, Agent, or Firm* — Myers Bigel, P.A.

(57) ABSTRACT

A semiconductor memory device includes a word line extending in a vertical direction, a semiconductor pattern having a ring-shaped horizontal cross-section that extends around the word line, a bit line disposed at a first end of the semiconductor pattern, and a capacitor structure disposed at second end of the semiconductor pattern. The capacitor structure includes a lower electrode layer electrically connected to the second end of the semiconductor pattern, having a ring-shaped horizontal cross-section, and including a connector extending in the vertical direction. A first segment extends in a horizontal direction from an upper end of the connector, and a second segment extends in the horizontal direction from a lower end of the connector. An upper electrode layer surrounded by the lower electrode layer, extends in the vertical direction, and a capacitor dielectric layer is between the lower electrode layer and the upper electrode layer.

20 Claims, 38 Drawing Sheets

(56) References Cited

U.S. PATENT DOCUMENTS

| | | |
|---|---|---|
| 2019/0006376 A1* | 1/2019 | Ramaswamy ......... H10B 41/27 |
| 2019/0304991 A1 | 10/2019 | Seo et al. |
| 2020/0083225 A1 | 3/2020 | Ma et al. |
| 2020/0202900 A1 | 6/2020 | Kang et al. |
| 2020/0203427 A1 | 6/2020 | Noh et al. |
| 2020/0227413 A1 | 7/2020 | Ward et al. |
| 2020/0251151 A1 | 8/2020 | Kang et al. |
| 2020/0279601 A1 | 9/2020 | Kim et al. |
| 2020/0286999 A1 | 9/2020 | Maeda et al. |
| 2020/0402991 A1 | 12/2020 | Jung et al. |
| 2021/0050052 A1 | 2/2021 | Okamoto et al. |
| 2021/0104527 A1 | 4/2021 | Son |
| 2021/0288066 A1 | 9/2021 | Tan et al. |

FOREIGN PATENT DOCUMENTS

| | | |
|---|---|---|
| KR | 20090122048 A | 11/2009 |
| KR | 20200008512 A | 1/2020 |
| TW | 201438198 A | 10/2014 |
| TW | 201730965 A | 9/2017 |
| TW | 201935660 A | 9/2019 |
| TW | 202036787 A | 10/2020 |
| TW | 202105782 A | 2/2021 |
| TW | 202109850 A | 3/2021 |

\* cited by examiner

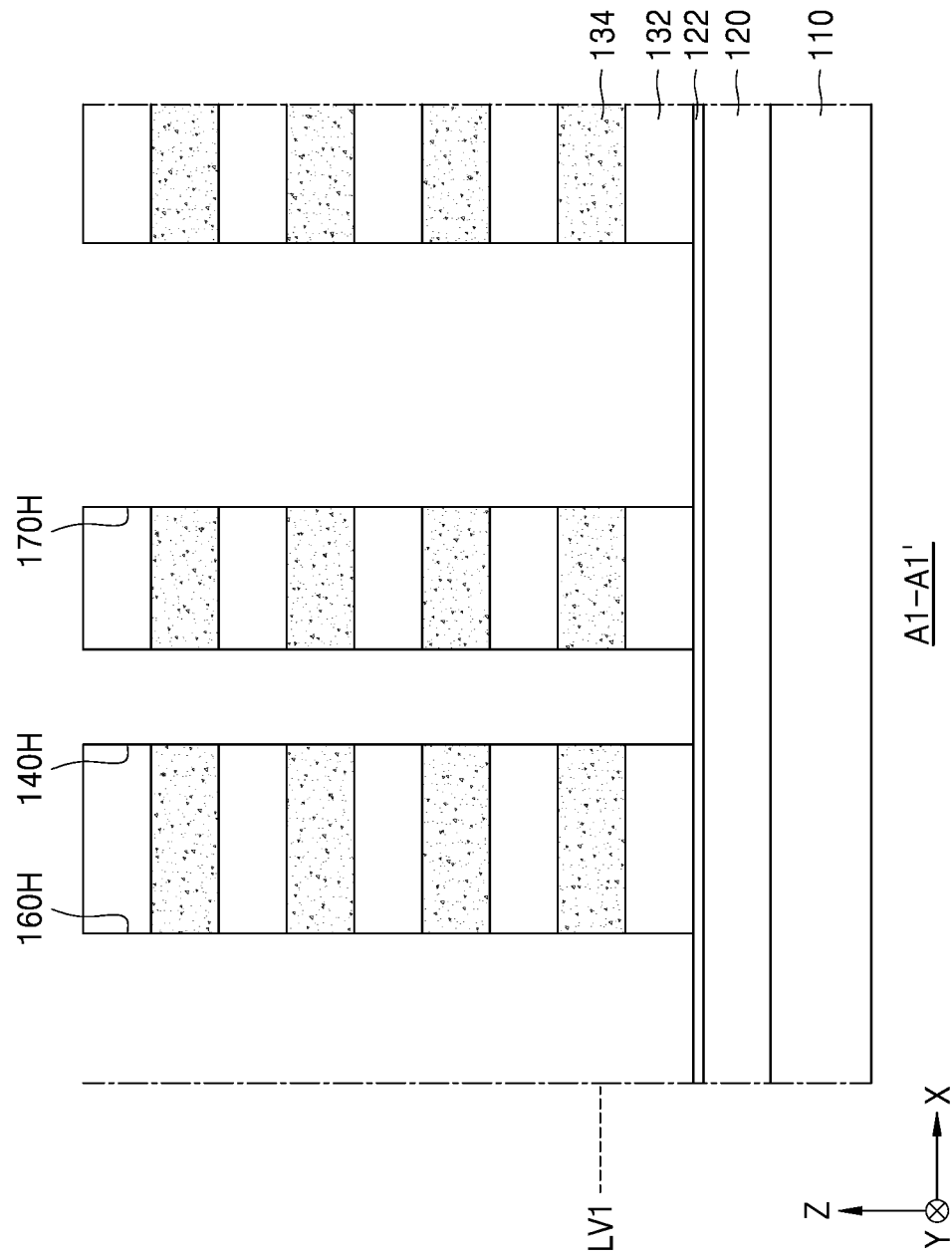

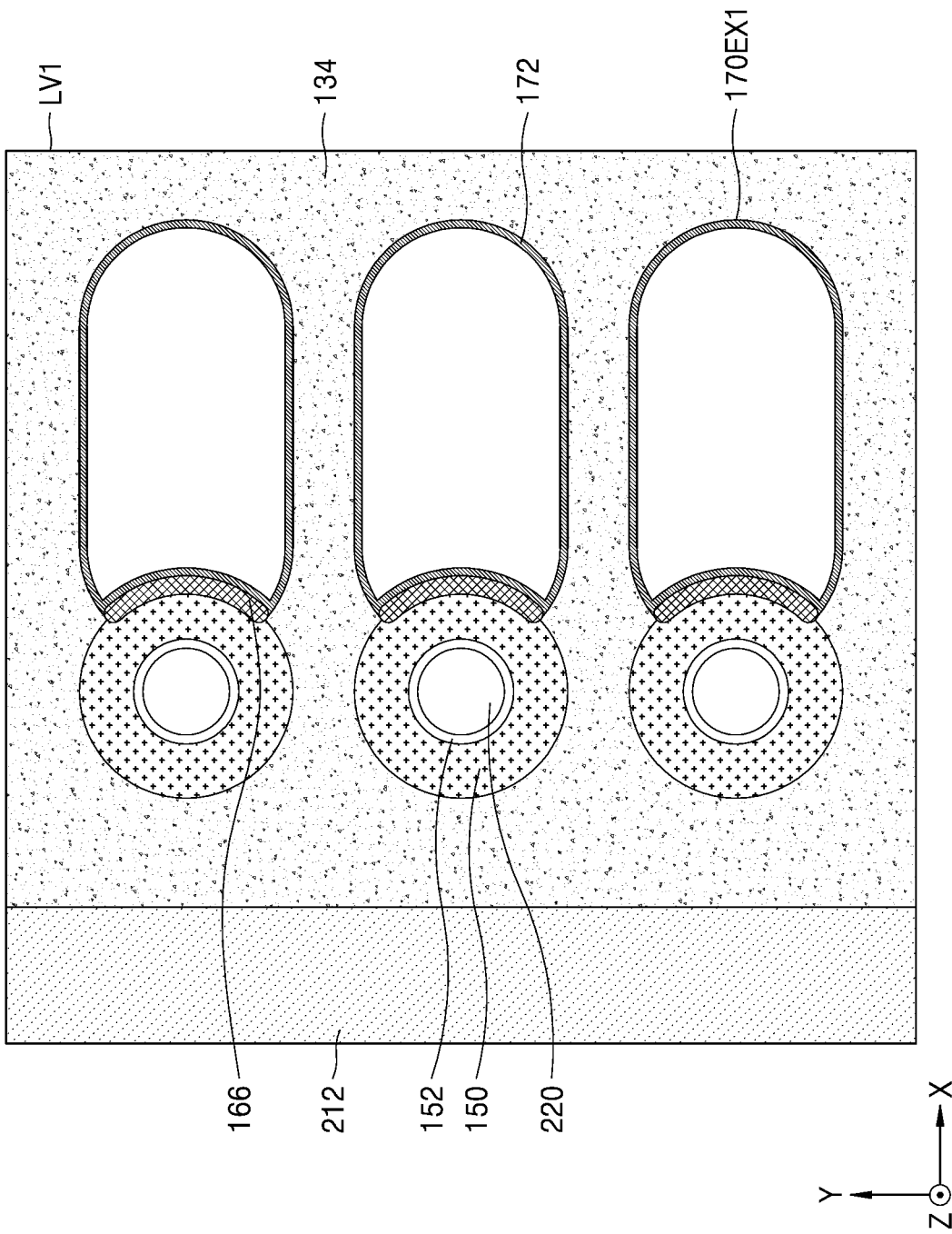

SEMICONDUCTOR MEMORY DEVICE

CROSS-REFERENCE TO RELATED APPLICATION

This application is based on and claims priority under 35 U.S.C. § 119 to Korean Patent Application No. 10-2021-0055949, filed on Apr. 29, 2021, in the Korean Intellectual Property Office, the disclosure of which is incorporated by reference herein in its entirety.

BACKGROUND

The inventive concept relates to a semiconductor memory device, and particularly, to a three-dimensional (3D) semiconductor memory device.

To meet the need for miniaturized, multifunctional, and high-performance electronic products, high-capacity semiconductor memory devices are needed, and in order to provide high-capacity semiconductor memory devices, an increased degree of integration may be needed. Since the degree of integration of two-dimensional (2D) semiconductor memory devices of the related art is mainly determined based on an area occupied by a unit memory cell, the degree of integration of 2D semiconductor memory devices is increasing, but is still limited. Therefore, 3D semiconductor memory devices have been proposed where a memory capacity increases by stacking a plurality of memory cells on a substrate in a vertical direction.

SUMMARY

The inventive concept provides a three-dimensional (3D) semiconductor memory device having an enhanced degree of integration.

According to some embodiments of the inventive concept, there is provided a semiconductor memory device including a word line extending in a vertical direction on a substrate, a semiconductor pattern having a ring-shaped horizontal cross-section and that extends around the word line in a plan view, a bit line at a first end of the semiconductor pattern in a first horizontal direction and extending in a second horizontal direction perpendicular to the first horizontal direction, and a capacitor structure at a second end opposite to the first end of the semiconductor pattern in the first horizontal direction. The capacitor structure includes a lower electrode layer electrically connected to the second end of the semiconductor pattern, having a ring-shaped horizontal cross-section, and including a connector extending in the vertical direction, a first segment extending in a horizontal direction from an upper end of the connector, and a second segment extending in the horizontal direction from a lower end of the connector. The semiconductor memory device includes an upper electrode layer that extends in the vertical direction, such that the upper electrode layer is on top and bottom surfaces of the first segment of the lower electrode layer, is on top and bottom surfaces of the second segment of the lower electrode layer, and is on an inner wall of the connector of the lower electrode layer. The semiconductor memory device includes a capacitor dielectric layer between the lower electrode layer and the upper electrode layer.

According to some embodiments of the inventive concept, there is provided a semiconductor memory device including a word line extending in a vertical direction on a substrate, a plurality of semiconductor patterns on the substrate, and each having a ring-shaped horizontal cross-section that extends around the word line in plan view, such that the plurality of semiconductor patterns are spaced apart from each other in the vertical direction, a plurality of mold insulating layers on the word line, spaced apart from each other in the vertical direction, and alternately arranged with the plurality of semiconductor patterns, a plurality of bit lines at respective first ends of the plurality of semiconductor patterns in a first horizontal direction, spaced apart from each other in the vertical direction, and extending in a second horizontal direction perpendicular to the first horizontal direction, and a capacitor structure at second ends that are opposite to the first ends of the plurality of semiconductor patterns in the first horizontal direction. The capacitor structure includes a plurality of lower electrode layers electrically connected to respective ones of the second ends of the plurality of semiconductor patterns, each having a ring-shaped horizontal cross-section, and each including a connector extending in the vertical direction, a first segment extending in a horizontal direction from an upper end of the connector, and a second segment extending in the horizontal direction from a lower end of the connector. The semiconductor memory device includes an upper electrode layer that extends in the vertical direction, such that the upper electrode layer is on respective top and bottom surfaces of the first segment of ones of the plurality of lower electrode layers, is on top and bottom surfaces of the second segment of ones of the plurality of lower electrode layers, and is on an inner wall of the connector of ones of the plurality of lower electrode layers. The semiconductor memory device includes a capacitor dielectric layer that extends between ones of the plurality of lower electrode layers and the upper electrode layer.

According to some embodiments of the inventive concept, there is provided a semiconductor memory device including a word line extending in a vertical direction on a substrate, a plurality of semiconductor patterns on the substrate, and each having a ring-shaped horizontal cross-section that extends around the word line in a plan view, the plurality of semiconductor patterns are spaced apart from each other in the vertical direction, a plurality of mold insulating layers on the word line, spaced apart from each other in the vertical direction, and alternately arranged with the plurality of semiconductor patterns, a plurality of bit lines at respective first ends of the plurality of semiconductor patterns in a first horizontal direction, spaced apart from each other in the vertical direction, and extending in a second horizontal direction perpendicular to the first horizontal direction, and a plurality of capacitor structures respected second ends opposite to the first ends of the plurality of semiconductor patterns in the first horizontal direction and spaced apart from each other in the vertical direction. The plurality of capacitor structures includes a plurality of lower electrode layers electrically connected to respective ones of the second ends of the plurality of semiconductor patterns and each having a ring-shaped horizontal cross-section, an upper electrode layer that extends in the vertical direction, and including a plurality of first protrusions that protrude toward respective ones of the plurality of lower electrode layers and a plurality of second protrusions that protrude toward respective ones of the plurality of mold insulating layers, and a capacitor dielectric layer that extends between ones of the plurality of lower electrode layers and the upper electrode layer.

BRIEF DESCRIPTION OF THE DRAWINGS

Embodiments of the inventive concept will be more clearly understood from the following detailed description taken in conjunction with the accompanying drawings in which:

FIGS. 15A to 26B are schematic diagrams illustrating a method of manufacturing a semiconductor memory device, according to embodiments. In particular, FIGS. 15A, 16A, 17A, 18A, 19A, 20A, 21A, 22A, 23A, 24A, 25A, and 26A are cross-sectional views taken along a line A1-A1' of FIG. 2, and FIGS. 15B, 16B, 17B, 18B, 19B, 20B, 21B, 22B, 23B, 24B, 25B, and 26B are horizontal cross-sectional views taken along a first vertical level of FIG. 3.

DETAILED DESCRIPTION

Hereinafter, embodiments of the inventive concept will be described in detail with reference to the accompanying drawings.

Figure 1:
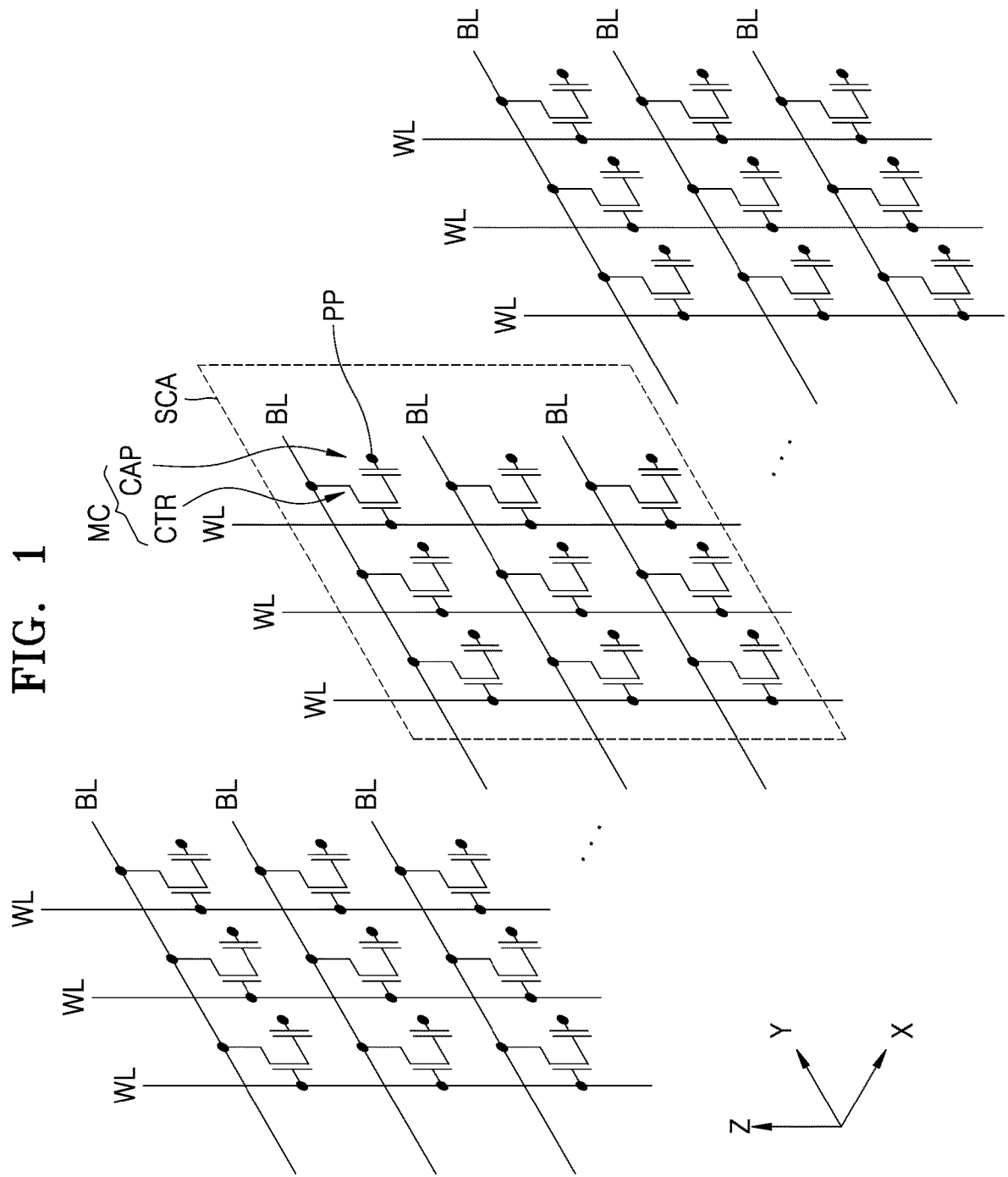
FIG. 1 is an equivalent circuit diagram illustrating a cell array of a semiconductor memory device according to some embodiments.

FIG. 1 is an equivalent circuit diagram illustrating a cell array of a semiconductor memory device according to some embodiments.

Referring to FIG. 1, the cell array of the semiconductor memory device may include a plurality of sub cell arrays SCA. The plurality of sub cell arrays SCA may be arranged in a first horizontal direction X.

Each of the plurality of sub cell arrays SCA may include a plurality of bit lines BL, a plurality of word lines WL, and a plurality of cell transistors CTR. One cell transistor CTR may be disposed between one word line WL and one bit line BL.

Each of the bit lines BL may include a conductive pattern (for example, a metal line) which is disposed spaced apart from a substrate, and may be on the substrate. The plurality of bit lines BL may extend in a second horizontal direction Y. Bit lines BL of one sub cell array SCA may be spaced apart from one another in a vertical direction Z.

Each of the word lines WL may include a conductive pattern (for example, a metal line) which extends in the vertical direction Z from the substrate. Word lines WL of one sub cell array SCA may be spaced apart from one another in the second horizontal direction Y.

A gate of each of the cell transistors CTR may be connected to a corresponding word line WL, and a source of each cell transistor CTR may be connected to a corresponding bit line BL. Each of the cell transistors CTR may be connected to a cell capacitor CAP. A drain of each cell transistor CTR may be connected to a first electrode of the cell capacitor CAP, and a second electrode of the cell capacitor CAP may be connected to a ground wiring PP.

Figure 2:
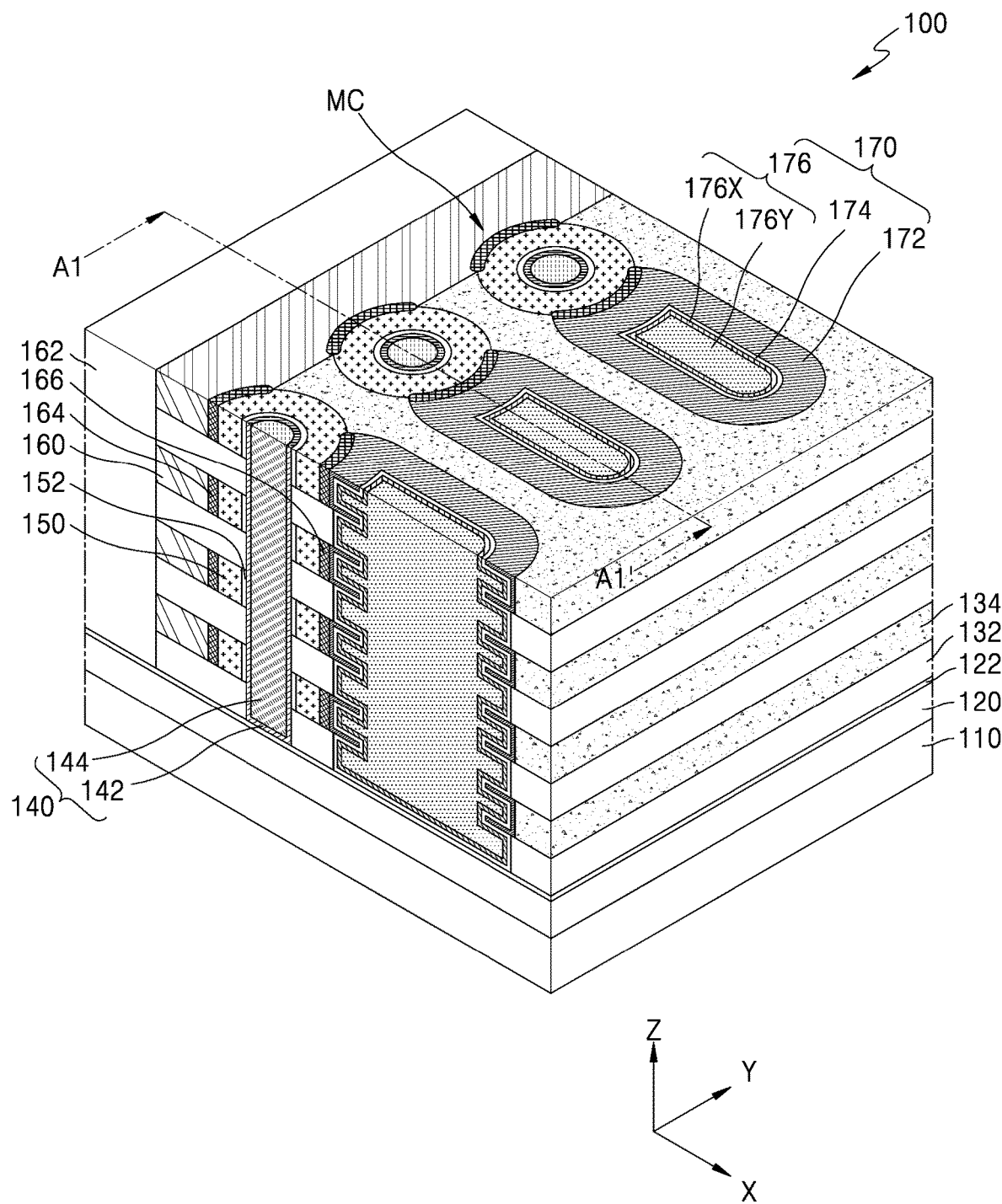
FIG. 2 is a perspective view illustrating a semiconductor memory device according to some embodiments.
Figure 3:
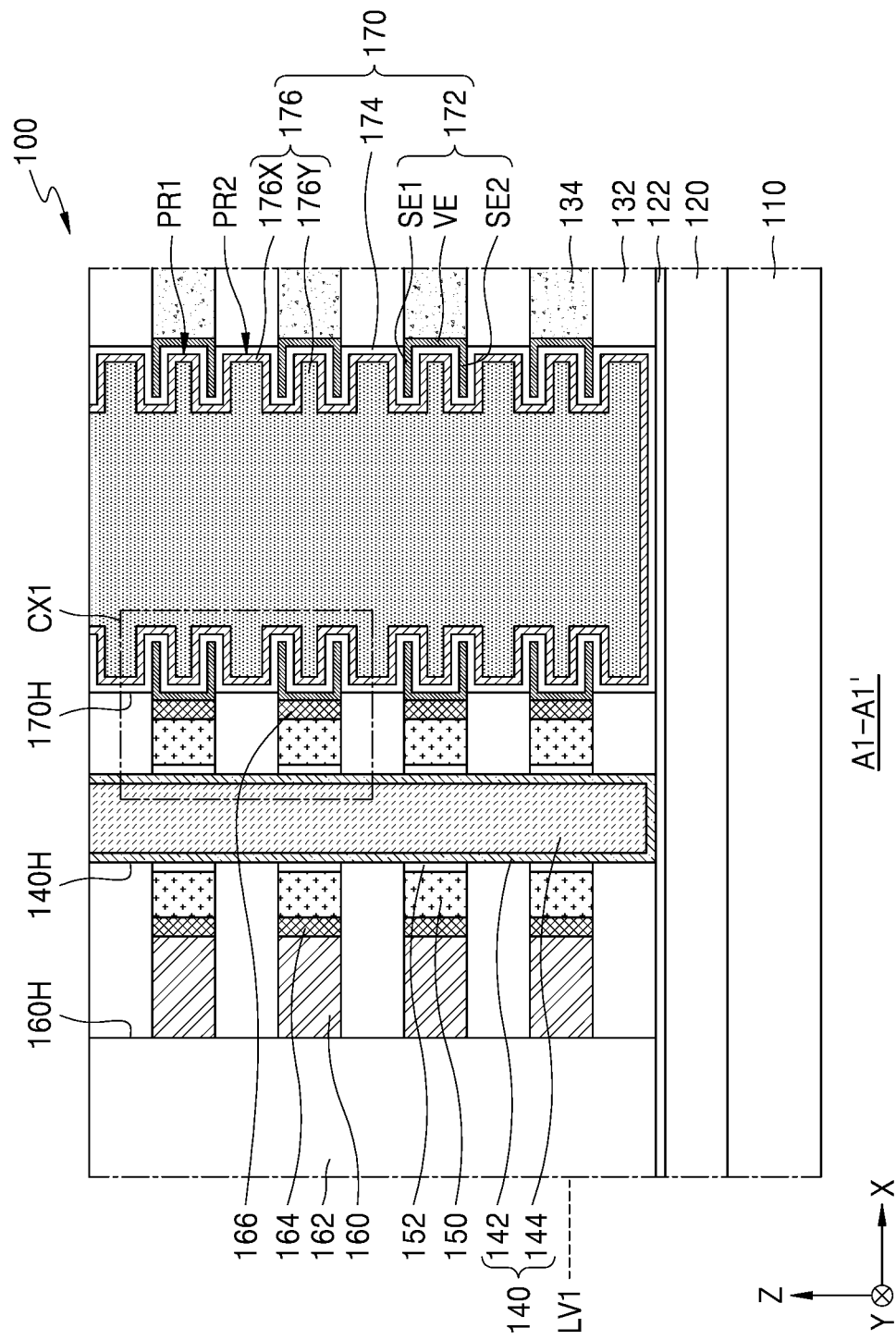
FIG. 3 is a cross-sectional view taken along a line A1-A1' of FIG. 2.
Figure 4:
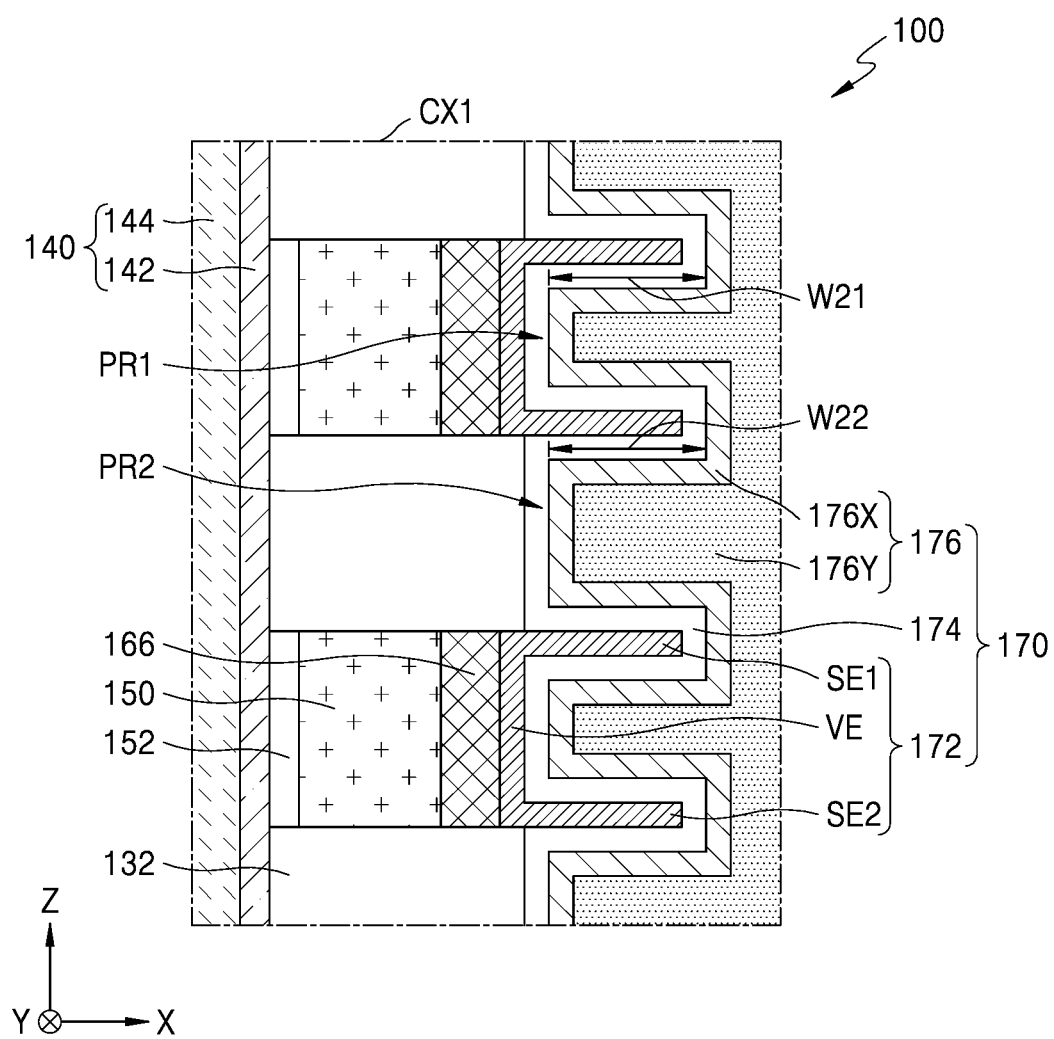
FIG. 4 is an enlarged view of a region of FIG. 3.
Figure 5:
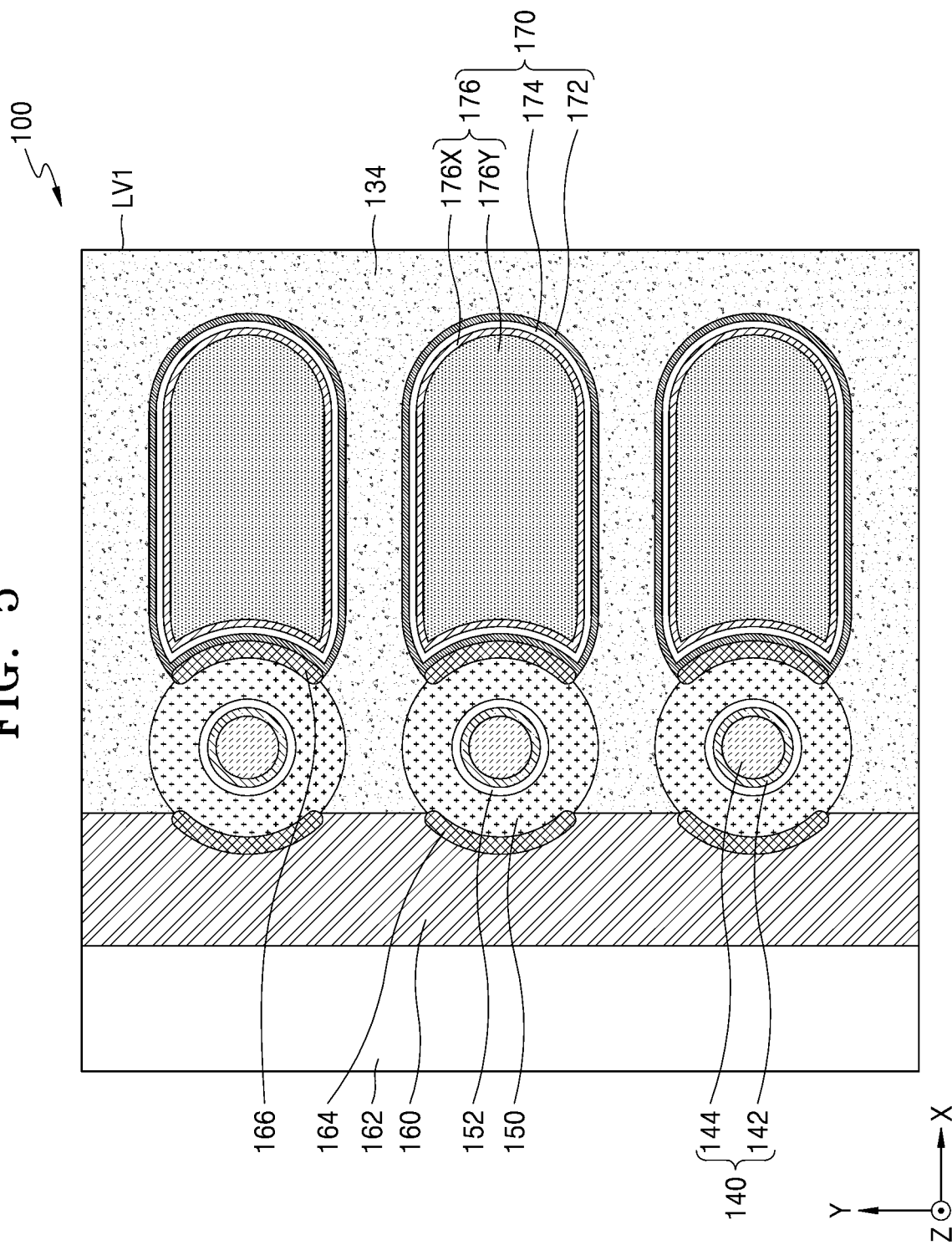
FIG. 5 is a horizontal cross-sectional view taken along a first vertical level of FIG. 3.
Figure 6:
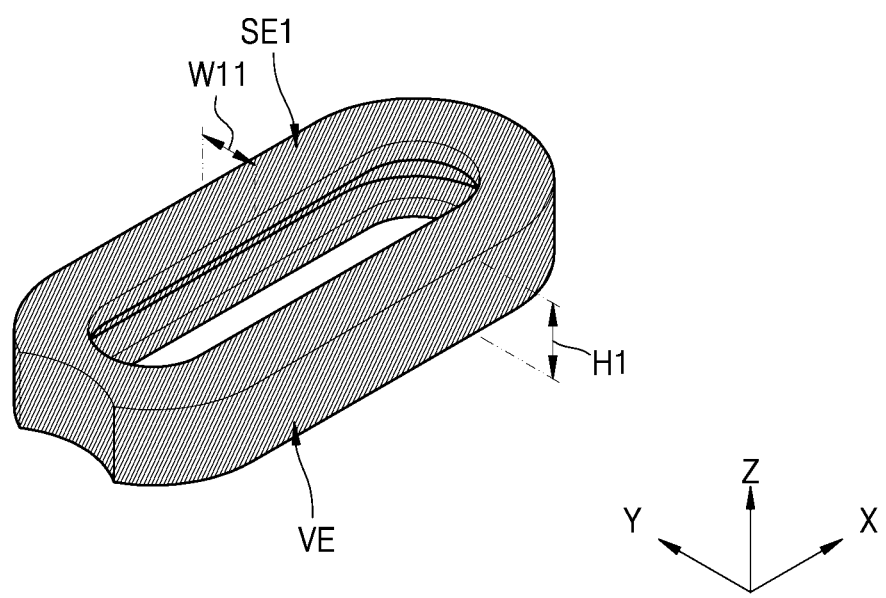
FIG. 6 is a schematic perspective view illustrating a lower electrode layer of FIG. 3.

FIG. 2 is a perspective view illustrating a semiconductor memory device 100 according to embodiments. FIG. 3 is a cross-sectional view taken along a line A1-A1' of FIG. 2 and FIG. 4 is an enlarged view of a region CX1 of FIG. 3. FIG. 5 is a horizontal cross-sectional view taken along a first vertical level LV1 of FIG. 3 and FIG. 6 is a schematic perspective view illustrating a lower electrode layer 172 of FIG. 3.

Referring to FIGS. 2 to 6, the semiconductor memory device 100 may include a plurality of word lines 140, a plurality of bit lines 160, and a plurality of memory cells MC, which are disposed on a substrate 110. Each of the plurality of memory cells MC may include a semiconductor pattern 150 and a capacitor structure 170.

The substrate 110 may include Si, Ge, or SiGe. Alternatively, for example, the substrate 110 may include a silicon-on-insulator (SOI) substrate or a germanium-on-insulator (GeOI) substrate.

A lower structure 120 may be arranged on the substrate 110. The lower structure 120 may include a peripheral circuit (not shown), a wiring layer (not shown) connected to the peripheral circuit, and an insulating layer (not shown) covering the peripheral circuit and the wiring layer. An etch stop layer 122 may be arranged on the lower structure 120. The etch stop layer 122 may include silicon nitride or silicon oxide.

A plurality of mold insulating layers 132 and a plurality of sacrificial insulating layers 134 may be alternately arranged on the etch stop layer 122. The plurality of mold insulating layers 132 and the plurality of sacrificial insulating layers 134 may each include at least one of silicon oxide, silicon nitride, or silicon oxynitride. In some embodiments, the plurality of mold insulating layers 132 and the plurality of sacrificial insulating layers 134 may include a material having etch selectivity with respect to each other. For example, the mold insulating layer 132 may include silicon oxide, and the sacrificial insulating layer 134 may include silicon nitride.

The plurality of word lines 140 may be spaced apart from each other in the second horizontal direction Y and may extend in the vertical direction Z. The plurality of word lines 140 may be arranged in a word line opening 140H passing through the plurality of mold insulating layers 132.

The plurality of word lines 140 may include a conductive barrier layer 142 disposed on the inner wall of the word line opening 140H, and a conductive filling layer 144 on the conductive barrier layer 142 and filling the inside of the word line opening 140H. For example, each of the conductive barrier layer 142 and the conductive filling layer 144 may include at least one of a doped semiconductor material (doped silicon, doped germanium, etc.), a conductive metal nitride (titanium nitride, tantalum nitride, etc.), a metal (tungsten, titanium, tantalum, etc.), or a metal-semiconductor compound (tungsten silicide, cobalt silicide, titanium silicide, etc.) FIG. 4 illustrates an example in which each of the plurality of word lines 140 has a horizontal and circular cross-section, but the inventive concept is not limited thereto.

A plurality of semiconductor patterns 150 may be arranged on a sidewall of each of the plurality of word lines 140 to be spaced apart from each other in the vertical direction Z. Each of the plurality of semiconductor patterns 150 may have a ring shape surrounding the sidewall of the first word line 140. The plurality of semiconductor patterns 150 and the plurality of mold insulating layers 132 may be arranged on the sidewall of the word line 140, and the mold insulating layers 132 may surround the sidewall of the word line 140 that is not covered by the plurality of semiconductor patterns 150.

The plurality of semiconductor patterns 150 may each include, for example, an undoped semiconductor material or a doped semiconductor material. In some embodiments, the plurality of semiconductor patterns 150 may each include polysilicon. In some embodiments, the plurality of semiconductor patterns 150 may each include an amorphous metal oxide, a polycrystalline metal oxide, or a combination of an amorphous metal oxide and a polycrystalline metal oxide, etc., for example, at least one of an In—Ga oxide (IGO), an In—Zn oxide (IZO), or an In—Ga—Zn oxide (IGZO). In some embodiments, the plurality of semiconductor patterns 150 may each include a two-dimensional (2D) material semiconductor, and the 2D material semiconductor may include, for example, $MoS_2$, $WSe_2$, graphene, carbon nanotubes, or a combination thereof.

A gate insulating layer 152 may be between the word line 140 and the semiconductor pattern 150. In some embodiments, as shown in FIG. 3, the gate insulating layer 152 may cover or overlap only the sidewall of the word line 140, which is surrounded by the semiconductor pattern 150. In this case, the gate insulating layer 152 may not be arranged on the sidewall of the word line 140, which is surrounded by the mold insulating layer 132, and the mold insulating layer 132 may directly contact the sidewall of the word line 140.

In some embodiments, unlike that shown in FIG. 3, the gate insulating layer 152 may extend in the vertical direction Z over the total height of the word line 140 to cover the entire sidewall of the word line 140. In this case, the gate insulating layer 152 may be between the mold insulating layer 132 and the word line 140, and the mold insulating layer 132 may not directly contact the word line 140.

In some embodiments, the gate insulating layer 152 may include at least one selected from a high-k dielectric material having a higher dielectric constant than that of silicon oxide, or a ferroelectric material. In some embodiments, the gate insulating layer 152 may include at least one selected from among hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), hafnium zirconium oxide (HfZrO), hafnium zirconium oxynitride (HfZrON), tantalum oxide (TaO), titanium oxide (TiO), barium strontium titanium oxide (BaSrTiO), barium titanium oxide (BaTiO), lead zirconium titanate (PZT), strontium bismuth tantalate (SBT), bismuth iron oxide (BFO), strontium titanium oxide (SrTiO), yttrium oxide (YO), aluminum oxide (AlO), or lead scandium tantalum oxide (PbScTaO). In some embodiments, the gate insulating layer 152 may include a metal oxide containing a dopant, and, for example, the dopant may include at least one of zirconium (Zr), gadolinium (Gd), lanthanum (La), silicon (Si), or aluminum (Al), but is not limited thereto. In some examples, the gate insulating layer 152 may include hafnium oxide with the dopant at a certain concentration.

A part of the word line 140, the semiconductor pattern 150 surrounding the part of the word line 140, and the gate insulating layer 152 between the word line 140 and the semiconductor pattern 150 may constitute the cell transistor CTR (see FIG. 1). Accordingly, one word line 140 and the plurality of semiconductor patterns 150 surrounding the one word line 140 may constitute the plurality of cell transistors CTR arranged in the vertical direction Z.

The plurality of bit lines 160 may be adjacent to one of the ends of the plurality of semiconductor patterns 150 to extend in the second horizontal direction Y and may be spaced apart from each other in the vertical direction Z. The mold insulating layer 132 may be arranged between two bit lines 160 adjacent to each other in the vertical direction Z. Each of the plurality of bit lines 160 may include one of a doped semiconductor material, a conductive metal nitride, a metal, and a metal-semiconductor compound.

A bit line insulating layer 162 may be disposed in the bit line opening 160H extending in the second horizontal direction Y through the plurality of mold insulating layers 132. A sidewall of the bit line insulating layer 162 may contact sidewalls of the plurality of bit lines 160 and sidewalls of the plurality of mold insulating layers 132.

A first impurity region 164 may be disposed between the plurality of bit lines 160 and the plurality of semiconductor patterns 150 connected thereto. In embodiments, the first impurity region 164 may include a semiconductor material doped with impurities at a high concentration. For example, the first impurity region 164 may be an n+ region.

A second impurity region 166 may be disposed between the plurality of semiconductor patterns 150 and the capacitor structure 170 connected thereto. In embodiments, the second impurity region 166 may include a semiconductor material doped with impurities at a high concentration. For example, the second impurity region 166 may be an n+ region.

The plurality of capacitor structures 170 may be arranged at the other ends of the plurality of semiconductor patterns 150. The plurality of capacitor structures 170 may be arranged inside a capacitor opening 170H extending in the vertical direction Z through the plurality of mold insulating layers 132 and the plurality of sacrificial insulating layers 134.

The plurality of capacitor structures 170 may extend in the vertical direction Z and may be spaced apart from each other in the second horizontal direction Y. One capacitor structure 170 may be connected to the plurality of semiconductor patterns 150 arranged to overlap each other in the vertical direction Z. In addition, the plurality of bit lines 160 may be arranged at one of the ends of the plurality of semiconductor patterns 150 in the first horizontal direction X, and the capacitor structure 170 may be arrange at the other ends of the plurality of semiconductor patterns 150 in the first horizontal direction X.

The capacitor structure 170 may include a plurality of lower electrode layers 172, a capacitor dielectric layer 174, and an upper electrode layer 176. The plurality of lower electrode layers 172 may be arranged at the other ends of the plurality of semiconductor patterns 150, and an outer surface of each of the plurality of lower electrode layers 172 may be surrounded by the plurality of sacrificial insulating layers 134. The upper electrode layer 176 may be surrounded by the plurality of lower electrode layers 172 and may extend in the vertical direction Z. The capacitor dielectric layer 174 may be between the plurality of lower electrode layers 172 and the upper electrode layer 176.

In some embodiments, each of the plurality of lower electrode layers 172 may have a ring-shaped horizontal cross-section. For example, as shown in FIG. 6, the plurality of lower electrode layers 172 each may have an elliptical horizontal cross-section in which a length in the first horizontal direction X is greater than a length in the second horizontal direction Y, but the inventive concept is not limited thereto. In some embodiments, lengths of the plurality of lower electrode layers 172 may be the same in the first horizontal direction X and in the second horizontal direction Y or may be less in the first horizontal direction X than in the second horizontal direction Y.

In some embodiments, each of the plurality of lower electrode layers 172 may have a U-shaped vertical cross-section rotated by 90 degrees. As shown in FIG. 3, each of the plurality of lower electrode layers 172 may include a connector VE extending in the vertical direction Z, a first segment SE1 extending in a horizontal direction from an upper end of the connector VE, and a second segment SE2 extending in the horizontal direction from a lower end of the connector VE. For example, a horizontal cross-section of each of the connector VE, the first segment SE1, and the second segment SE2 may have a ring shape. The connector VE may be disposed on an inner wall of the capacitor opening 170H, and an outer surface of the connector VE may be surrounded by the plurality of sacrificial insulating layers 134. The first segment SE1 and the second segment SE2 may protrude from the connector VE toward the inside of the capacitor opening 170H and extend in the horizontal direction.

In some embodiments, the first segment SE1 may have a first width W11 in the second horizontal direction Y, and the connector VE may have a first height H1 in the vertical direction Z. In some examples, a ratio of the first width W11 with respect to the first height H1 may be 0.5 to 5, but is not limited thereto. When the first width W11 with respect to the first height H1 is 0.5 to 5, in a process of forming the lower electrode layer 172, an opening (for example, a first expansion space 170EX1 (refer to FIG. 20A) in which the lower electrode layer 172 is to be formed may have a relatively low aspect ratio, and accordingly, a difficulty of the process of forming the lower electrode layer 172 may be reduced.

In some embodiments, the upper electrode layer 176 may include a plurality of first protrusions PR1 protruding outward toward the plurality of lower electrode layers 172, and a plurality of second protrusions PR2 protruding outward toward the plurality of mold insulating layers 132. For example, each of the plurality of first protrusions PR1 and the plurality of second protrusions PR2 may have a ring-shaped horizontal cross-section. The plurality of first protrusions PR1 and the plurality of second protrusions PR2 may be alternately arranged in the vertical direction Z, and may overlap each other in the vertical direction Z. Both outer surfaces of the plurality of first protrusions PR1 and outer surfaces of the plurality of second protrusions PR2 may be conformally covered or overlapped by the capacitor dielectric layer 174. In some embodiments, the capacitor dielectric layer may conformally overlap a surface of the first protrusion of the upper electrode layer and a surface of the second protrusion of the upper electrode layer such that the capacitor dielectric layer has a substantially uniform thickness along the surfaces of the first and second protrusions.

In some embodiments, the upper electrode layer 176 may cover or overlap a top surface and a bottom surface of the first segment SE1 of the lower electrode layer 172, a top surface and a bottom surface of the second segment SE2, and an inner wall of the connector VE. Each of the plurality of first protrusions PR1 may be filled in a space defined by the inner wall of the connector VE of one first lower electrode layer 172, the bottom surface of the first segment SE1, and the top surface of the second segment SE2, and the plurality of second protrusions PR2 may be filled in a space defined by the inner wall of the capacitor opening 170H, the bottom surface of the second segment SE2 of the one first lower electrode layer 172, and the top surface of the first segment SE1 of the other first lower electrode layer 172 at a higher level than the plurality of first protrusions PR1.

As shown in FIG. 4, the plurality of first protrusions PR1 may have a first width W21 in the first horizontal direction X, and the plurality of second protrusions PR2 may have a second width W22 in the first horizontal direction X. The second width W22 may be less than or equal to the first width W11.

In some embodiments, the lower electrode layer 172 may include a doped semiconductor material, a conductive metal nitride such as titanium nitride, tantalum nitride, niobium nitride, or tungsten nitride, a metal such as ruthenium, iridium, titanium, or tantalum, or a conductive metal oxide such as iridium oxide or niobium oxide, or a combination thereof.

In some embodiments, the upper electrode layer 176 may include a first upper electrode layer 176X and a second upper electrode layer 176Y. For example, the first upper electrode layer 176X may be disposed on the capacitor dielectric layer 174 to have a conformal thickness, and the second upper electrode layer 176Y may be filled in an inner space of the capacitor opening 170H on the first upper electrode layer 174X. Each of the first upper electrode layer 176X and the second upper electrode layer 176Y may include a doped semiconductor material, a conductive metal nitride such as titanium nitride, tantalum nitride, niobium nitride, or tungsten nitride, a metal such as ruthenium, iridium, titanium, or tantalum, or a conductive metal oxide such as iridium oxide or niobium oxide, or a combination thereof.

In some embodiments, the capacitor dielectric layer 174 may include at least one selected from a high-k dielectric material, which has a higher dielectric constant than silicon oxide, or a ferroelectric material. In some embodiments, the capacitor dielectric layer 174 may include at least one selected from among hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), lead zirconium titanate (PZT), strontium bismuth tantalate (SBT), bismuth iron oxide (BFO), strontium titanium oxide (SrTiO), yttrium oxide (YO), aluminum oxide (AlO), or lead scandium tantalum oxide (PbScTaO).

According to a semiconductor memory device according to the comparative example, a surface of an inner region of a lower electrode having a ring-shaped horizontal cross-section (e.g., a region corresponding to the bottom surface of the first segment SE1, the inner wall of the connector VE, and the top surface of the second segment SE2) is surrounded by an upper electrode layer, and the top surface of the first segment SE1 and the bottom surface of the second segment SE2 are covered or overlapped by the mold insulating layer 132. Accordingly, an effective electrode area of a lower electrode layer capable of affecting capacitance is relatively small.

However, according to some embodiments, the bottom and top surfaces of the first segment SE1 of the lower electrode layer 172, the inner wall of the connector VE, and the bottom and top surfaces of the second segment SE2 of the lower electrode layer 172 may be surrounded by the upper electrode layer 176 with the capacitor dielectric layer 174 therebetween. Accordingly, the bottom and top surfaces of the first segment SE1 of the lower electrode layer 172, the inner wall of the connector VE, and the bottom and top surfaces of the second segment SE2 of the lower electrode layer 172 may act as effective electrode regions of the capacitor structure 170. Accordingly, the capacitor structure 170 may have a relatively high capacitance compared to conventional designs.

Also, according to some embodiments, because the plurality of memory cells MC configured by the cell transistor CTR and the capacitor structure 170 may be stacked in the vertical direction Z, the semiconductor memory device 100 may have a high memory capacity.

Figure 7:
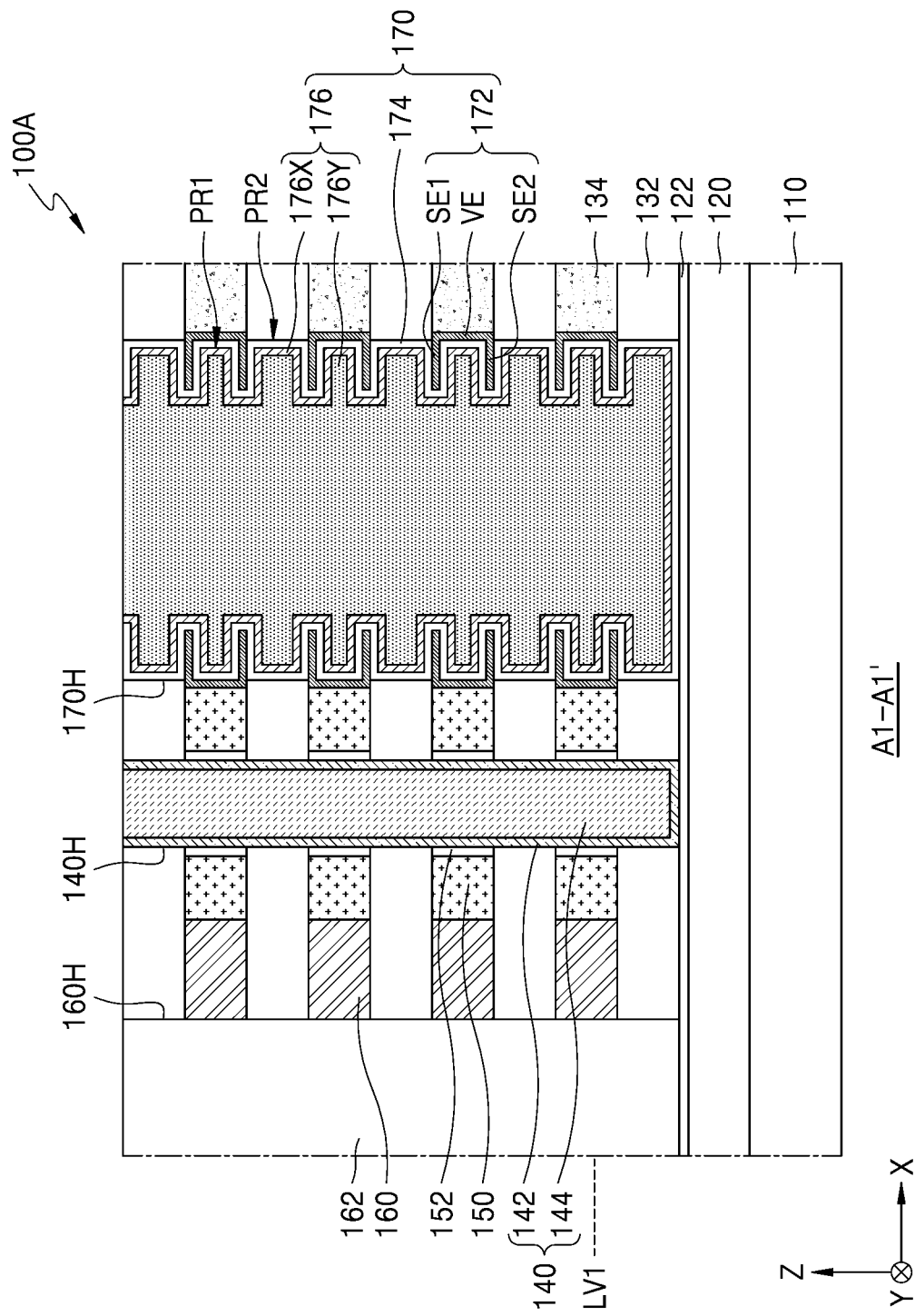
FIG. 7 is a cross-sectional view illustrating a semiconductor memory device according to some embodiments.
Figure 8:
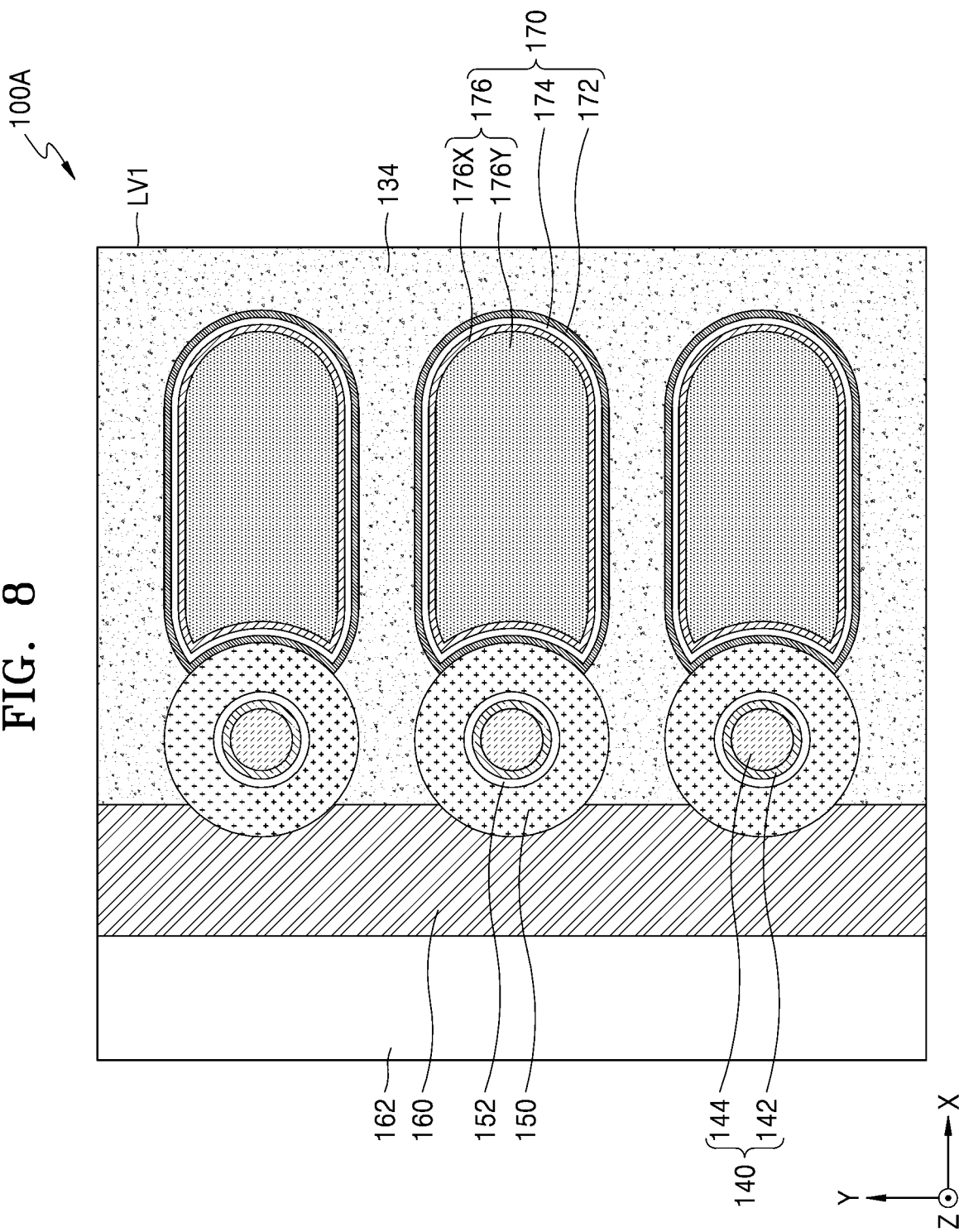
FIG. 8 is a horizontal cross-sectional view taken along a first vertical level of FIG. 7.

FIG. 7 is a cross-sectional view illustrating a semiconductor memory device 100A according to some embodiments. FIG. 8 is a horizontal cross-sectional view taken along the first vertical level LV1 of FIG. 7.

Referring to FIGS. 7 and 8, the semiconductor pattern 150 may include an amorphous metal oxide, a polycrystalline metal oxide, or a combination of an amorphous metal oxide and a polycrystalline metal oxide, etc., for example, at least one of an In—Ga oxide (IGO), an In—Zn oxide (IZO), or an In—Ga—Zn oxide (IGZO).

The first impurity region 164 (refer to FIG. 3) disposed between the semiconductor pattern 150 and the bit line 160 may be omitted, and the semiconductor pattern 150 may be in direct contact with the bit line 160. The second impurity region 166 (refer to FIG. 3) disposed between the semiconductor pattern 150 and the lower electrode layer 172 may be omitted, and the semiconductor pattern 150 may directly contact the lower electrode layer 172.

According to some embodiments, because the semiconductor pattern 150 includes a metal oxide-based material, a leakage current may be significantly reduced.

Figure 9:
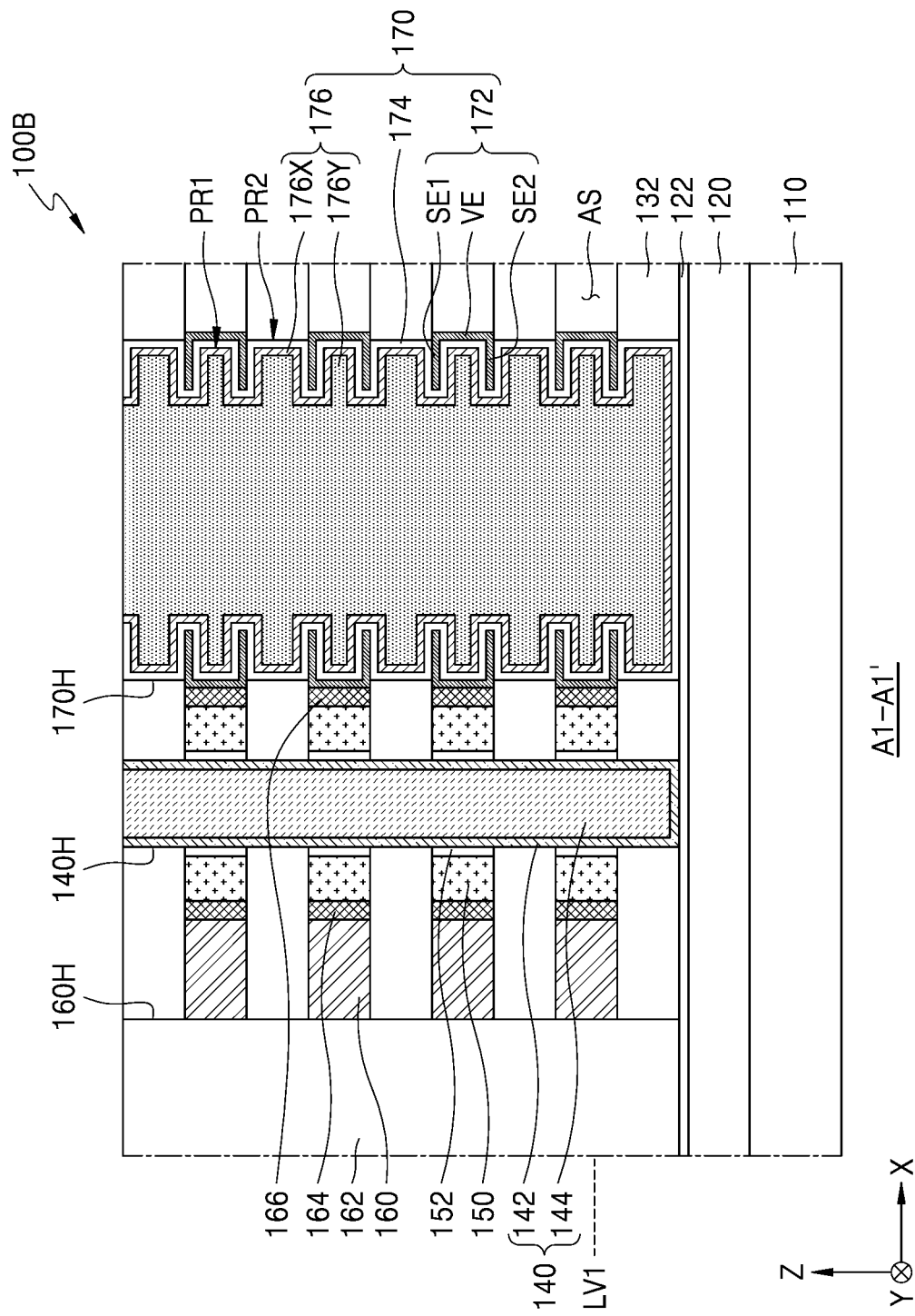
FIG. 9 is a cross-sectional view illustrating a semiconductor memory device according to some embodiments.
Figure 10:
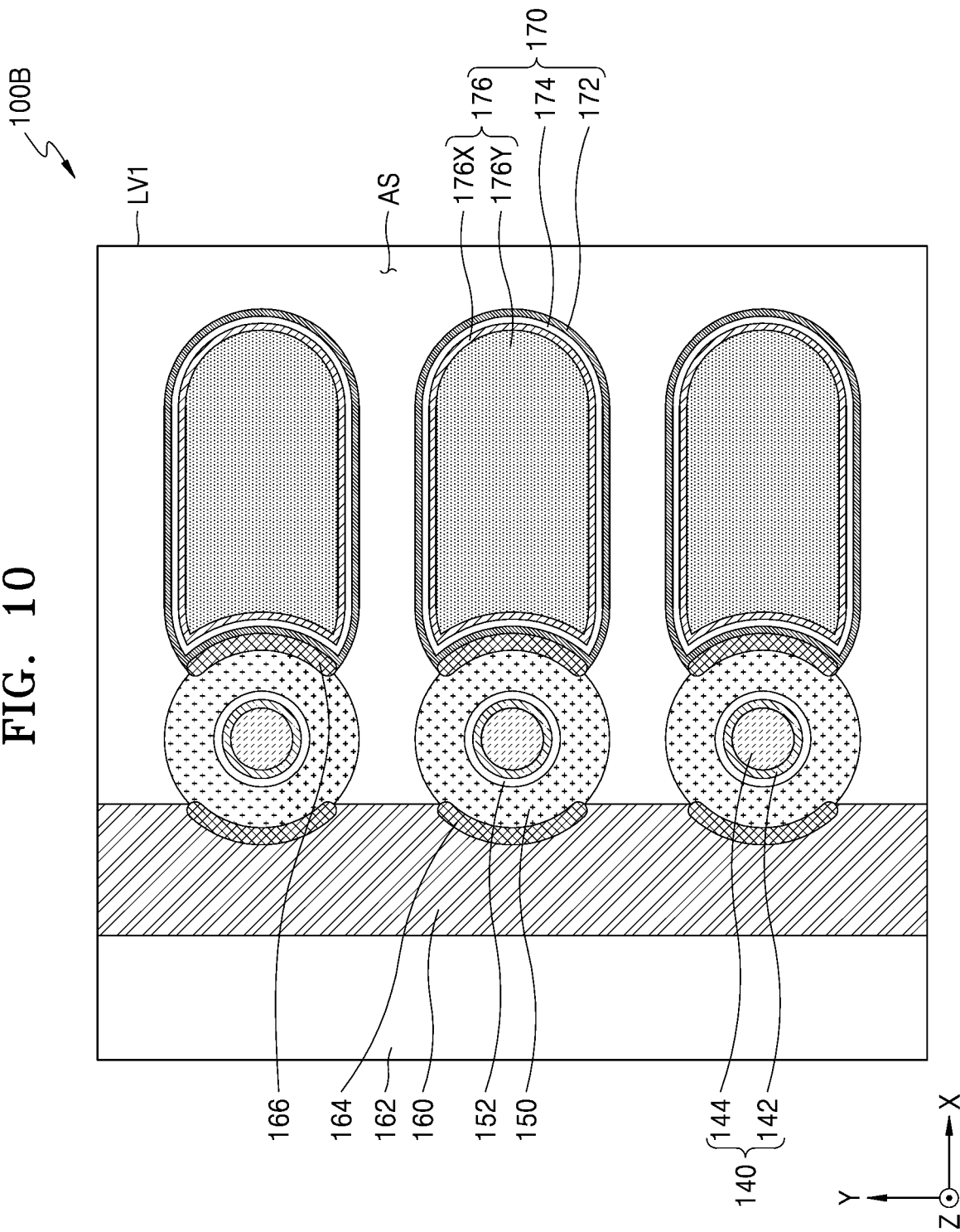
FIG. 10 is a horizontal cross-sectional view taken along a first vertical level of FIG. 9.

FIG. 9 is a cross-sectional view illustrating a semiconductor memory device 100B according to some embodiments. FIG. 10 is a horizontal cross-sectional view taken along the first vertical level LV1 of FIG. 9.

Referring to FIGS. 9 and 10, the plurality of sacrificial insulating layers 134 (refer to FIG. 3) may be omitted, and an air space AS may be disposed instead. Accordingly, the plurality of mold insulating layers 132 and the plurality of air spaces AS may be alternately arranged in the vertical direction Z. It will be understood that "air space" may be, for example, any void or cavity, and may be a space filled with air (e.g., an air-gap), a space filled with an inert gas(es) (e.g., an inert gas gap), a space defining a vacuum.

Outer surfaces of the plurality of semiconductor patterns 150 and outer surfaces of the plurality of lower electrode layers 172 may be surrounded by the air space AS. The air space AS may reduce a parasitic capacitance inside the semiconductor memory device 100A, thereby improving an operating speed of the semiconductor memory device 100A.

Figure 11:
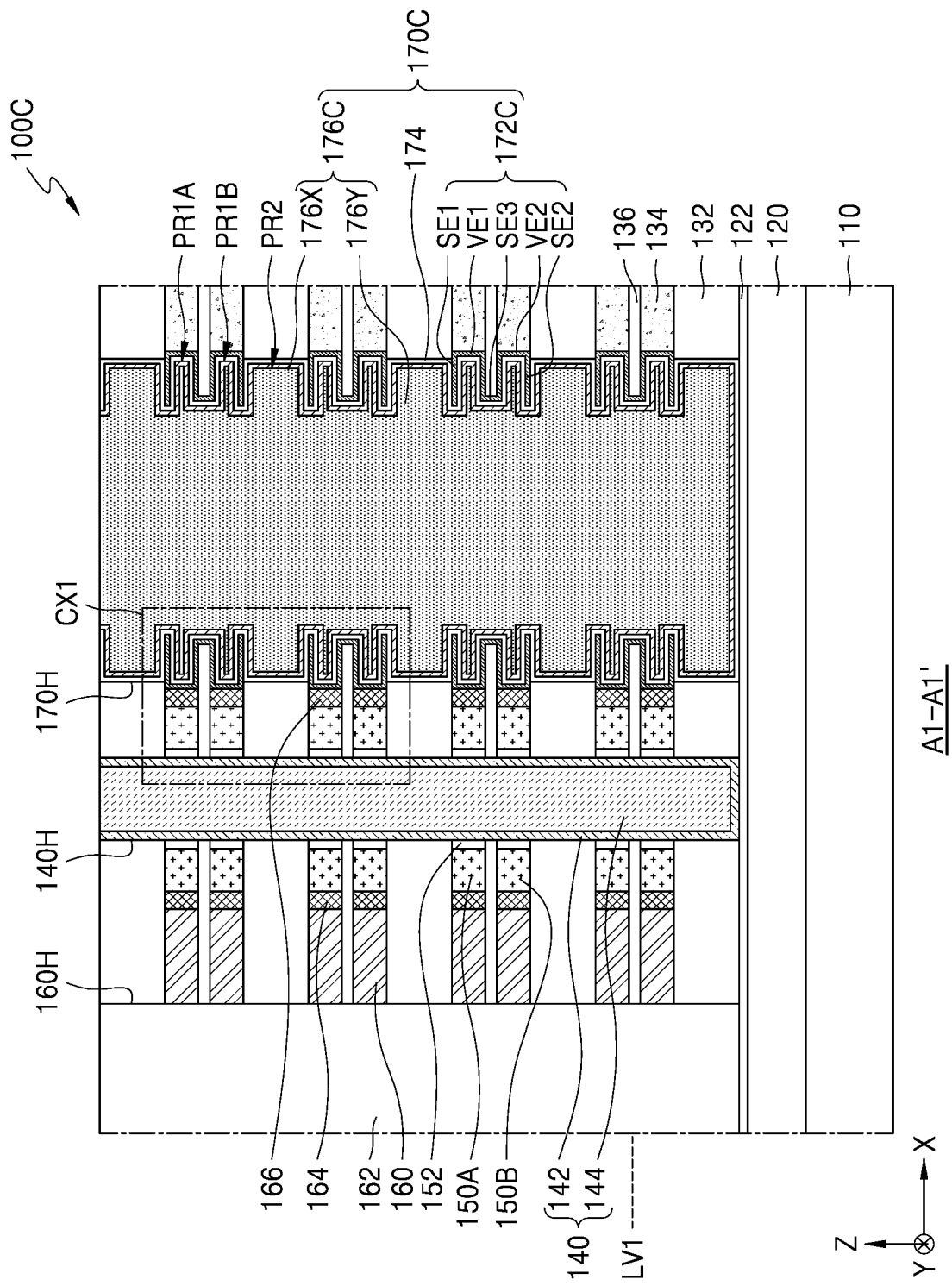
FIG. 11 is a cross-sectional view illustrating a semiconductor memory device according to some embodiments.
Figure 12:
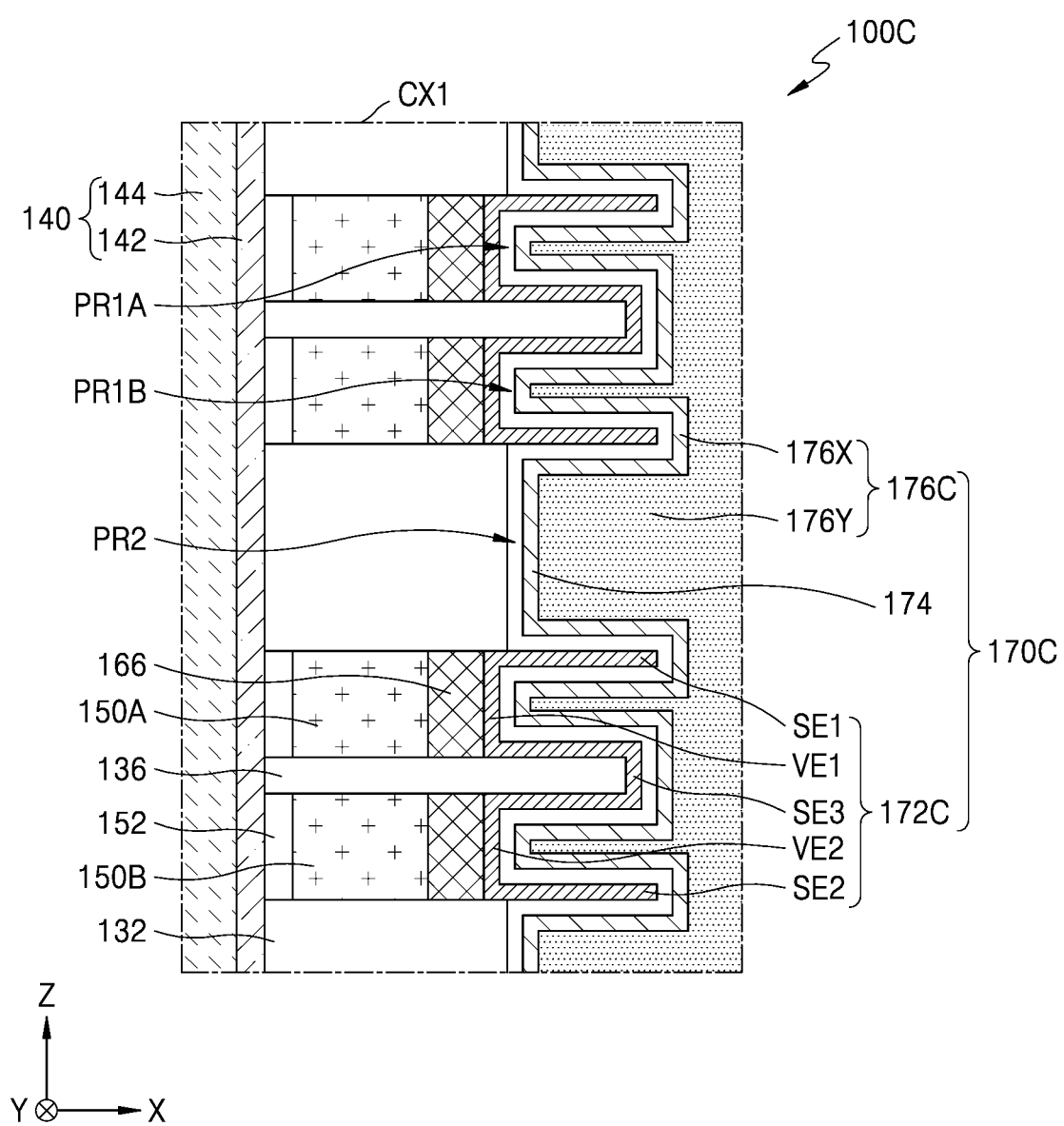
FIG. 12 is an enlarged view of a region of FIG. 11.

FIG. 11 is a cross-sectional view illustrating a semiconductor memory device 100C according to some embodiments. FIG. 12 is an enlarged view of the region CX1 of FIG. 11.

Referring to FIGS. 11 and 12, the semiconductor memory device 100C may include a first semiconductor pattern 150A and a second semiconductor pattern 150B instead of the plurality of semiconductor patterns 150 (see FIG. 3), and the first semiconductor pattern 150A and the second semiconductor pattern 150B may have a sandwiched shape with an intermediate insulating layer 136 disposed therebetween. The intermediate insulating layer 136 may extend into the capacitor structure 170C such that each lower electrode layer 172C may have a double U-shaped cross-section.

A lower electrode layer 172C of a capacitor structure 170C may include a first connector VE1, a second connector VE2, the first segment SE1, the second segment SE2, and a third segment SE3. The first connector VE1 may extend in the vertical direction Z at the same vertical level as the first semiconductor pattern 150A, and the first segment SE1 may extend in the horizontal direction from an upper end of the first connector VE1. The second connector VE2 may extend in the vertical direction Z at the same vertical level as the second semiconductor pattern 150B, and the second segment SE2 may extend in the horizontal direction from a lower end of the second connector VE2. The third segment SE3 may extend from the lower end of the first connector VE1 to the upper end of the second connector VE2, surrounding top and bottom surfaces of the intermediate insulating layer 136.

The upper electrode layer 176C may include a first sub-protrusion PR1A, a second sub-protrusion PR1B, and the second protrusion PR2, the first sub-protrusion PR1A may protrude toward the lower electrode layer 172C at the same vertical level as that of the first semiconductor pattern 150A, and the second sub-protrusion PR1B may protrude toward the lower electrode layer 172C at the same vertical level as that of the second semiconductor pattern 150B.

According to some embodiments, the first connector VE1, the second connector VE2, the first segment SE1, and the second segment SE2 of the lower electrode layer 172C may serve as effective electrodes of the capacitor structure 170C, and the third segment SE3 surrounding the top and bottom surfaces of the intermediate insulating layer 136 may also serve as an effective electrode region of the capacitor structure 170C. Accordingly, because an effective electrode area between the lower electrode layer 172C and the upper electrode layer 176C may increase, the capacitor structure 170C may have an increased capacitance, and the semiconductor memory device 100C may have an increased memory capacity.

Figure 13:
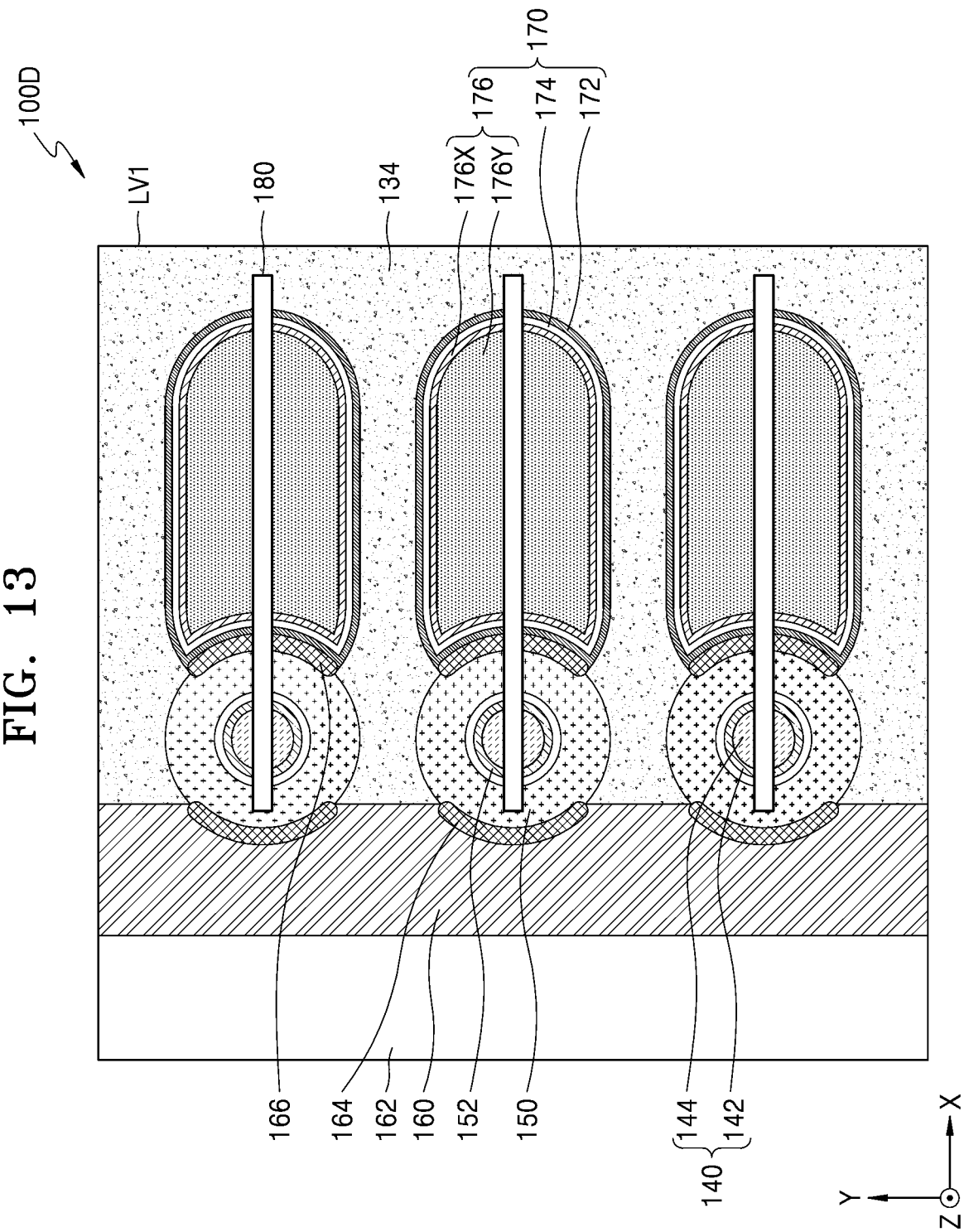
FIG. 13 is a plan view illustrating a semiconductor memory device according to some embodiments.

FIG. 13 is a plan view illustrating a semiconductor memory device 100D according to some embodiments.

Referring to FIG. 13, the semiconductor memory device 100D may further include a separation insulating layer 180 extending in the first horizontal direction X by bisecting the semiconductor pattern 150, the word line 140, and the capacitor structure 170. The separation insulating layer 180 may include an insulating material such as silicon oxide. The semiconductor memory device 100D may be a split cell in which two cell transistors CTR (refer to FIG. 1) are defined by the separation insulating layer 180.

Figure 14:
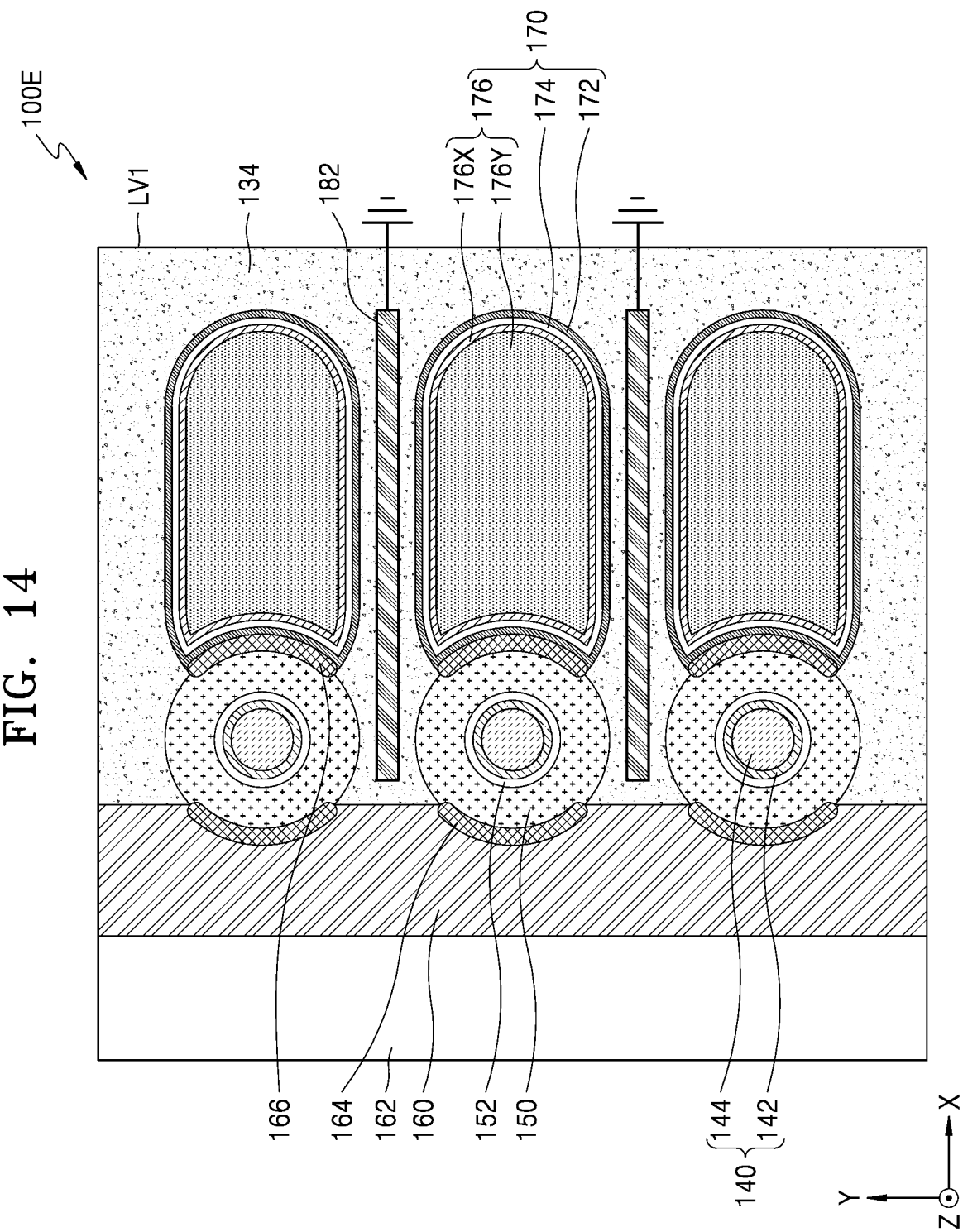
FIG. 14 is a plan view illustrating a semiconductor memory device according to some embodiments.

FIG. 14 is a plan view illustrating a semiconductor memory device 100E according to some embodiments.

Referring to FIG. 14, the semiconductor memory device 100E may include a shielding layer 182 extending in the first horizontal direction X between two semiconductor patterns 150 and two capacitor structures 170 adjacent to each other in the second horizontal direction Y. The shielding layer 182 may shield electromagnetic interference that may occur between the two semiconductor patterns 150 and two capacitor structures 170 adjacent to each other.

FIGS. 15A to 26B are schematic diagrams illustrating a method of manufacturing the semiconductor memory device 100, according to embodiments. In particular, FIGS. 15A, 16A, 17A, 18A, 19A, 20A, 21A, 22A, 23A, 24A, 25A, and 26A are cross-sectional views taken along a line A1-A1' of FIG. 2, and FIGS. 15B, 16B, 17B, 18B, 19B, 20B, 21B, 22B, 23B, 24B, 25B, and 26B are horizontal cross-sectional views taken along the first vertical level LV1 of FIG. 3.

Figure 15A:
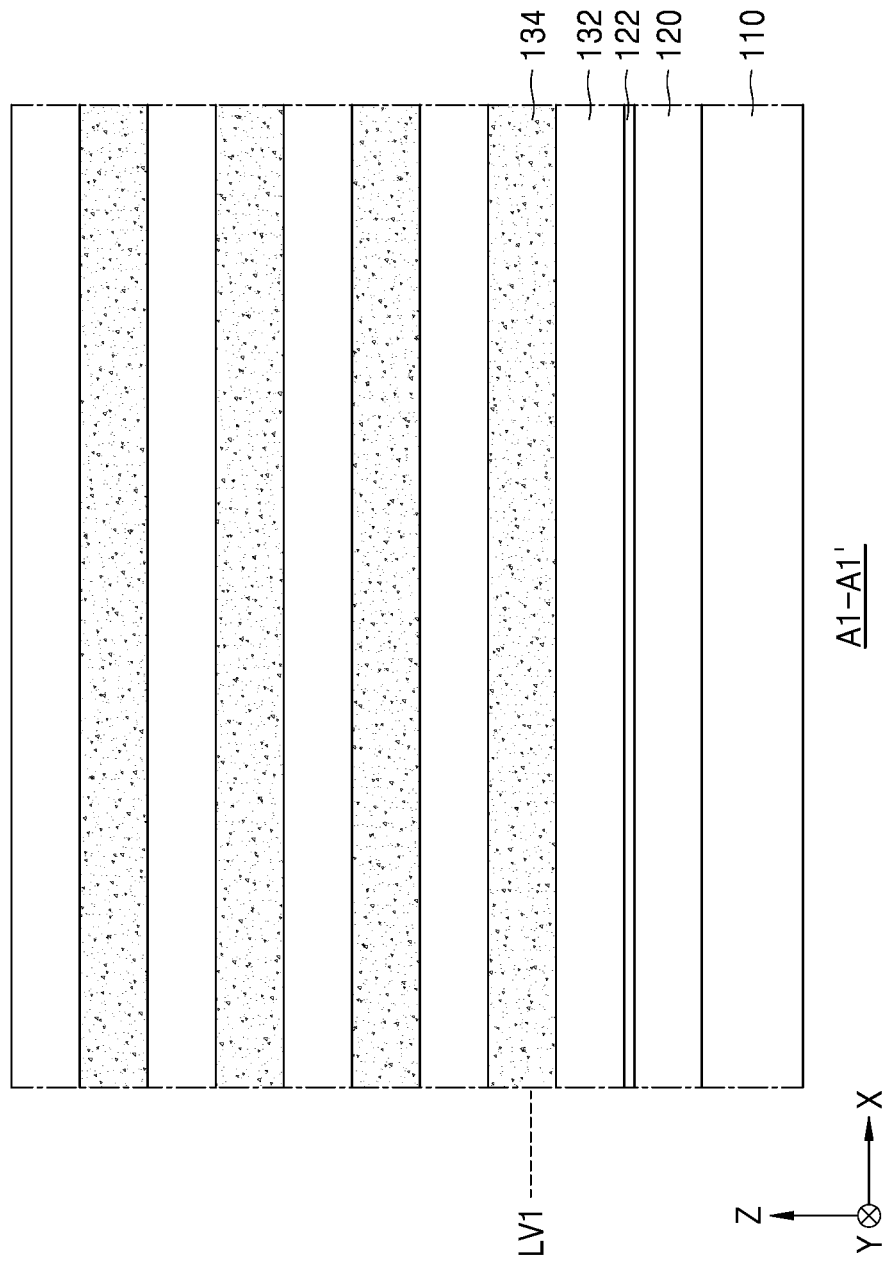
Figure 15B:
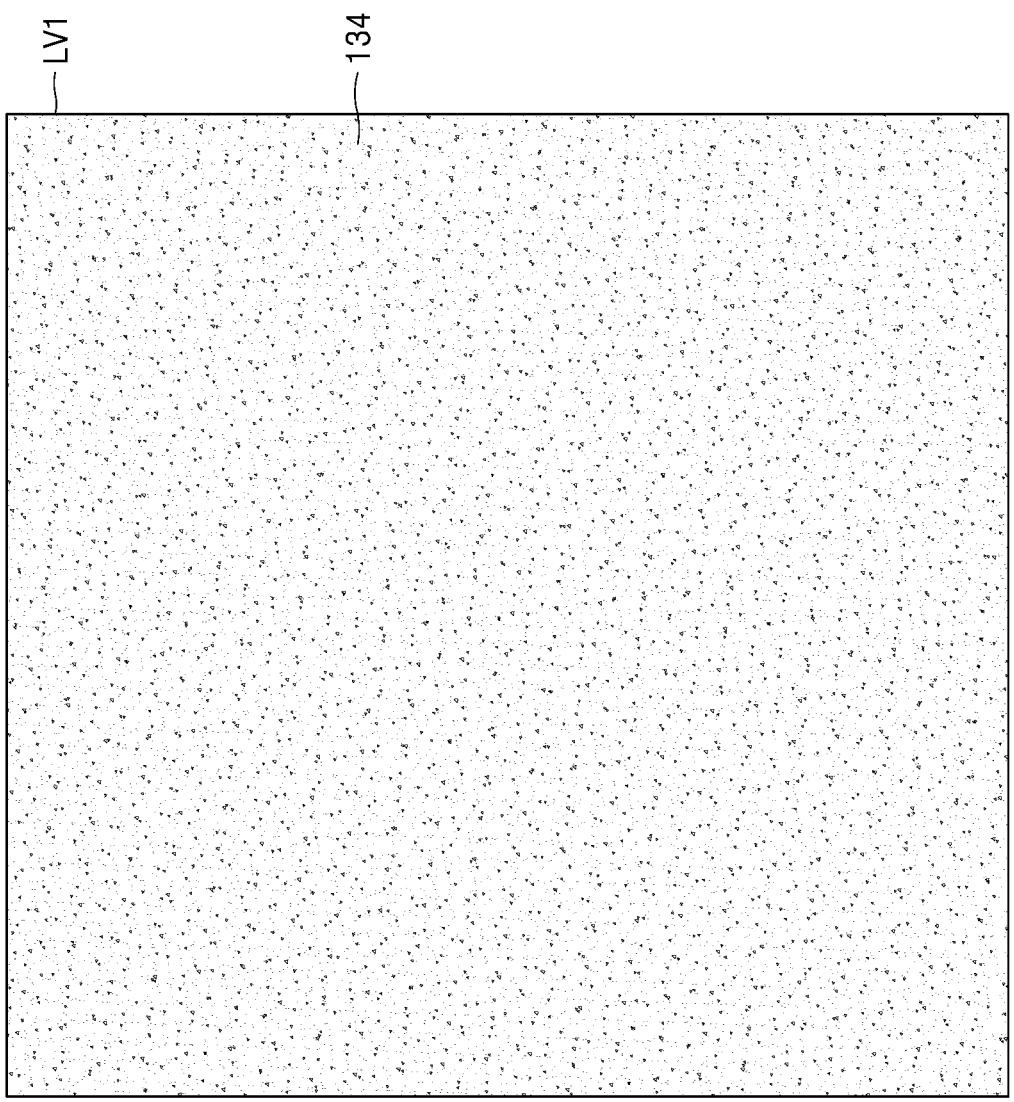

Referring to FIGS. 15A and 15B, the lower structure 120 and the etch stop layer 122 may be formed on the substrate 110. The plurality of mold insulating layers 132 and the plurality of sacrificial insulating layers 134 may be alternately and sequentially formed on the etch stop layer 122.

The plurality of mold insulating layers 132 and the plurality of sacrificial insulating layers 134 may be formed by a chemical vapor deposition (CVD) process, a plasma enhanced CVD (PECVD) process, or an atomic layer deposition (ALD) process.

In some embodiments, the plurality of mold insulating layers 132 and the plurality of sacrificial insulating layers 134 may be respectively formed of materials having etch selectivity with respect to each other. For example, the plurality of mold insulating layers 132 may be formed of silicon oxide, and the plurality of sacrificial insulating layers 134 may be formed of silicon nitride. The plurality of mold insulating layers 132 and the plurality of sacrificial insulating layers 134 may each have a thickness of several tens of nanometers.

Figure 16B:
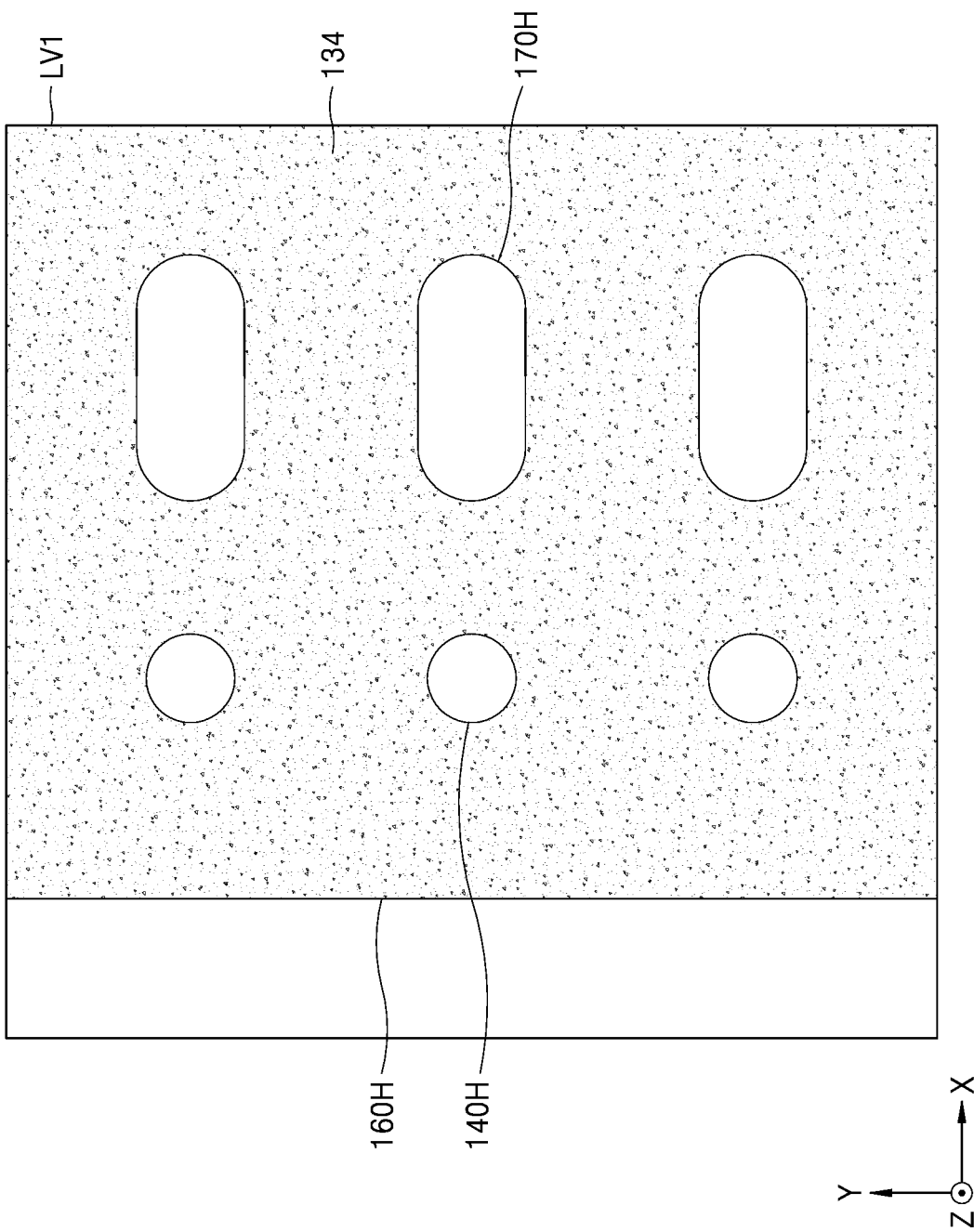

Referring to FIGS. 16A and 16B, a mask pattern (not shown) may be formed on the plurality of mold insulating layers 132 and the plurality of sacrificial insulating layers 134, and a word line opening 140H, a bit line opening 160H, and the capacitor opening 170H may be formed by partially removing the plurality of mold insulating layers 132 and the plurality of sacrificial insulating layers 134 by using the mask pattern as an etching mask.

In some embodiments, a top surface of the etch stop layer 122 may be exposed at respective bottom surfaces of the word line opening 140H, the bit line opening 160H, and the capacitor opening 170H.

In some embodiments, the word line opening 140H and the capacitor opening 170H may each have a horizontal cross-section having a circular or elliptical shape. A plurality of word line openings 140H may be spaced apart from each other in the second horizontal direction Y and may extend in the vertical direction Z. A plurality of capacitor openings 170H may be spaced apart from each other in the second horizontal direction Y and may extend in the vertical direction Z. The bit line opening 160H may extend in the second horizontal direction Y.

For example, although each of the word line opening 140H, the bit line opening 160H, and the capacitor opening 170H is shown as having an equal horizontal width over the total height thereof, unlike this, each of the word line opening 140H, the bit line opening 160H, and the capacitor opening 170H may have a tapered shape having a decreasing horizontal width toward the substrate 110.

Figure 17A:
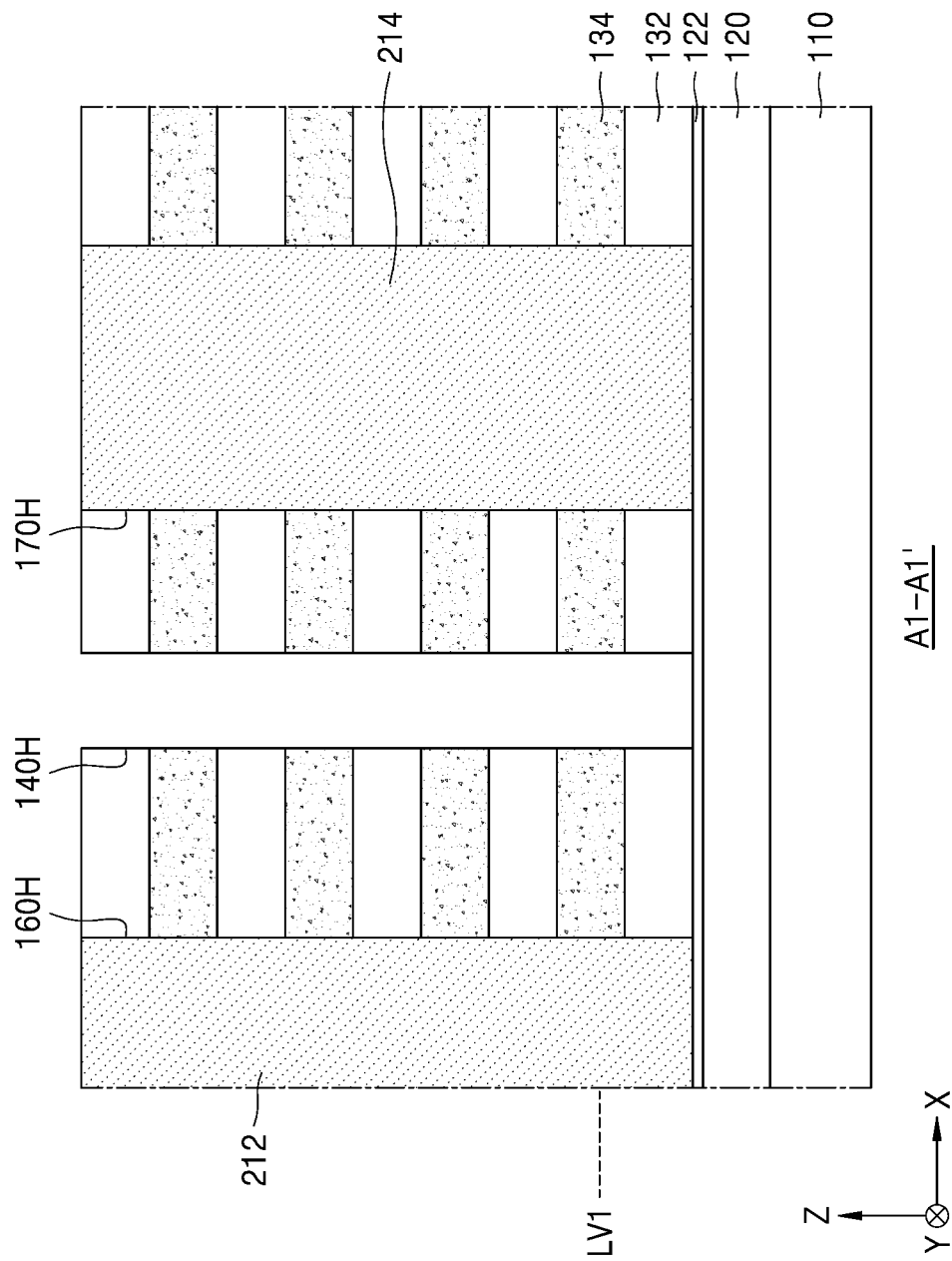
Figure 17B:
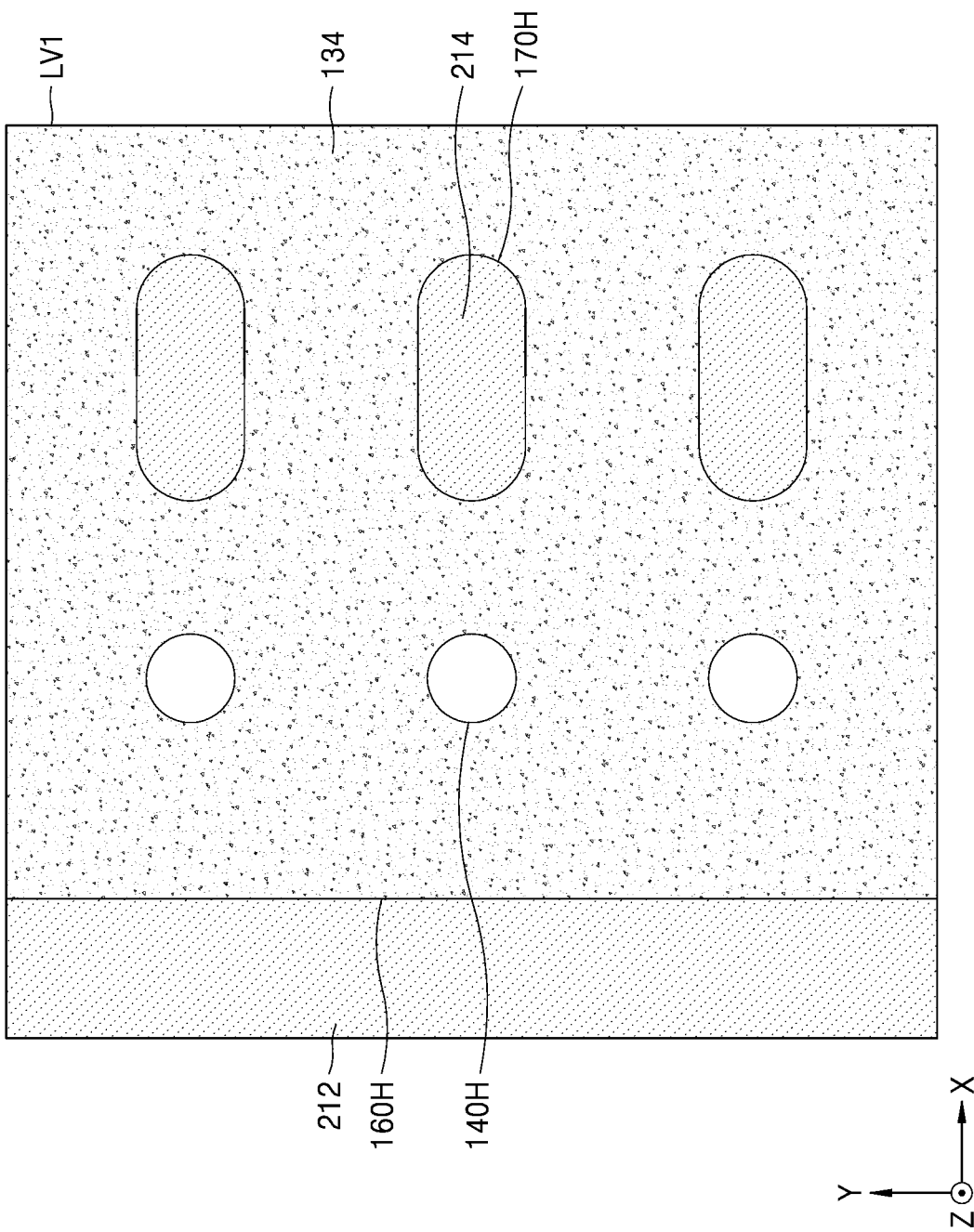

Referring to FIGS. 17A and 17B, a first sacrificial filling layer 212 filled in the bit line opening 160H and a second sacrificial filling layer 214 filled in the capacitor opening 170H may be formed.

For example, each of the first sacrificial filling layer 212 and the second sacrificial filling layer 214 may include a material having etch selectivity with respect to the mold insulating layer 132 and the sacrificial insulating layers 134. For example, each of the first sacrificial filling layer 212 and the second sacrificial filling layer 214 may include polysilicon or a carbon-containing material.

Figure 18A:
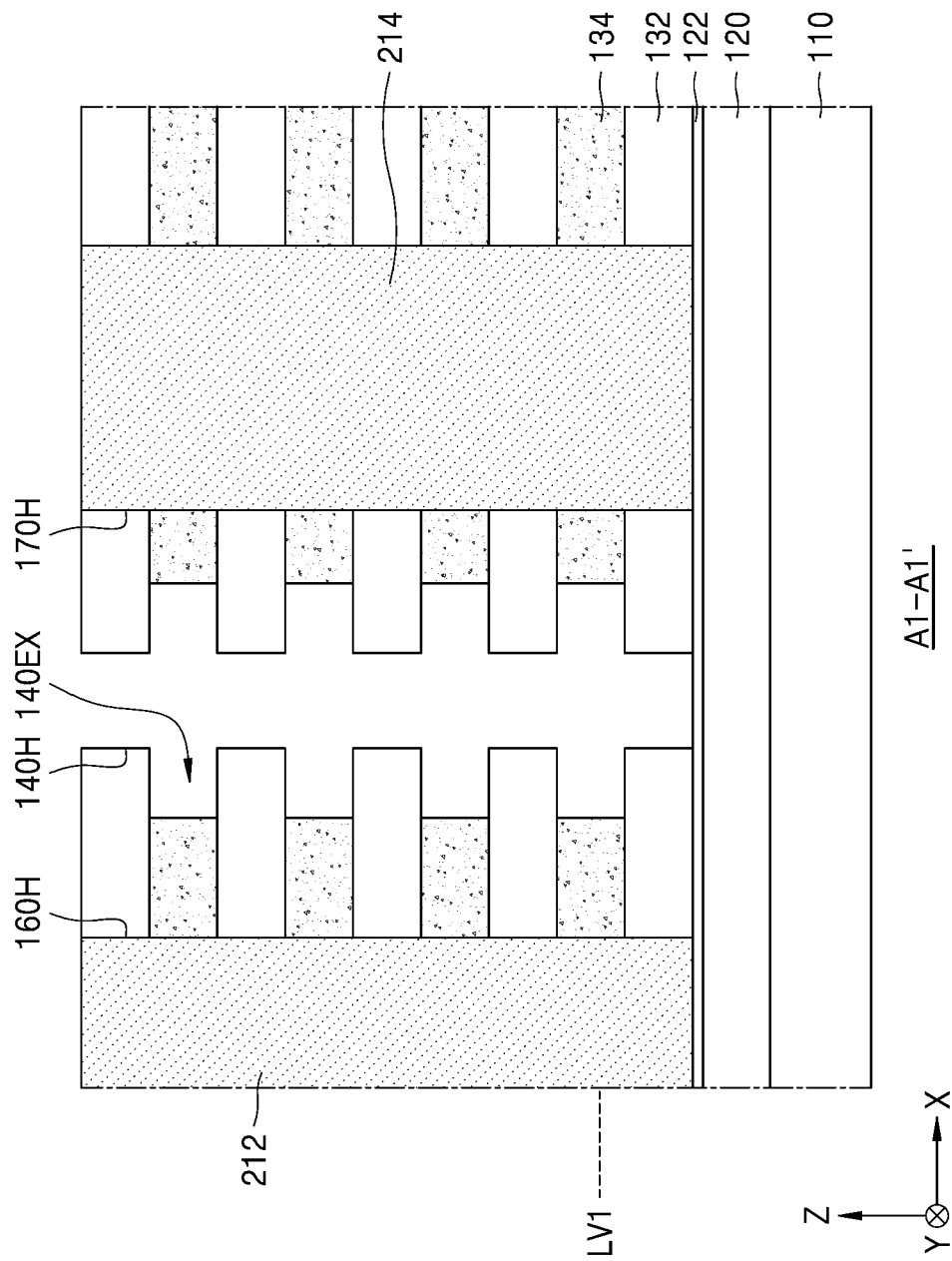
Figure 18B:
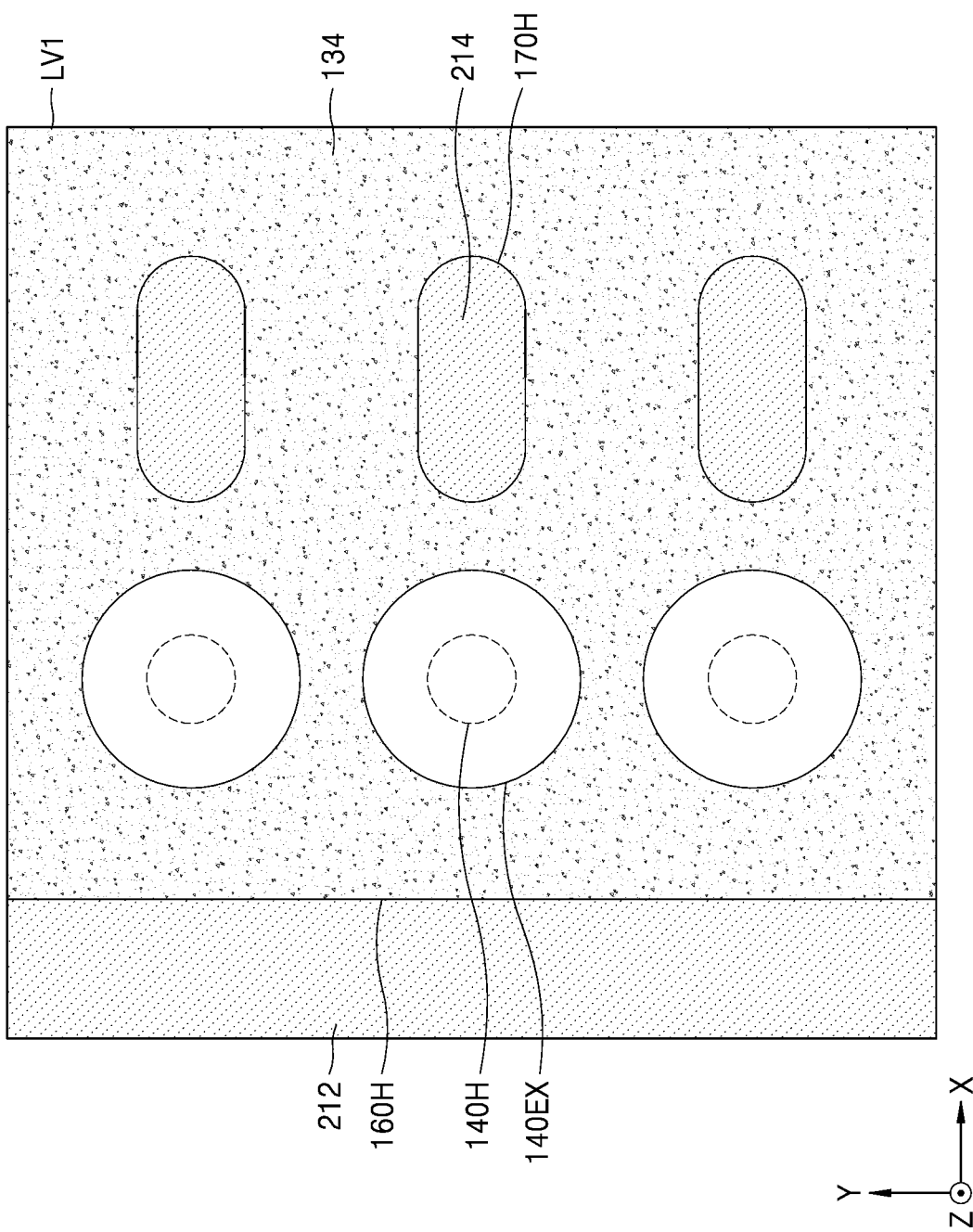

Referring to FIGS. 18A and 18B, an expansion space 140EX, which communicates with the word line opening 140H, may be formed by removing a part of the sacrificial insulating layer 134, which is exposed by the word line opening 140H. The expansion space 140EX may be formed by removing a part of the sacrificial insulating layer 134 adjacent to the word line opening 140H such that the first sacrificial filling layer 212 filled in the bit line opening 160H and the second sacrificial filling layer 214 filled in the capacitor opening 170H are not exposed.

Because the expansion space 140EX is formed by removing the part of the sacrificial insulating layer 134 exposed by the word line opening 140H, the expansion space 140EX may have an approximately constant width in a horizontal direction from the word line opening 140H. In some embodiments, the expansion space 140EX may have a width of several tens of nanometers in the horizontal direction from the word line opening 140H. The height of the expansion space 140EX may be substantially the same as the height of the sacrificial insulating layer 134. In some embodiments, the expansion space 140EX may have a height of several tens of nanometers in the vertical direction Z.

Figure 19A:
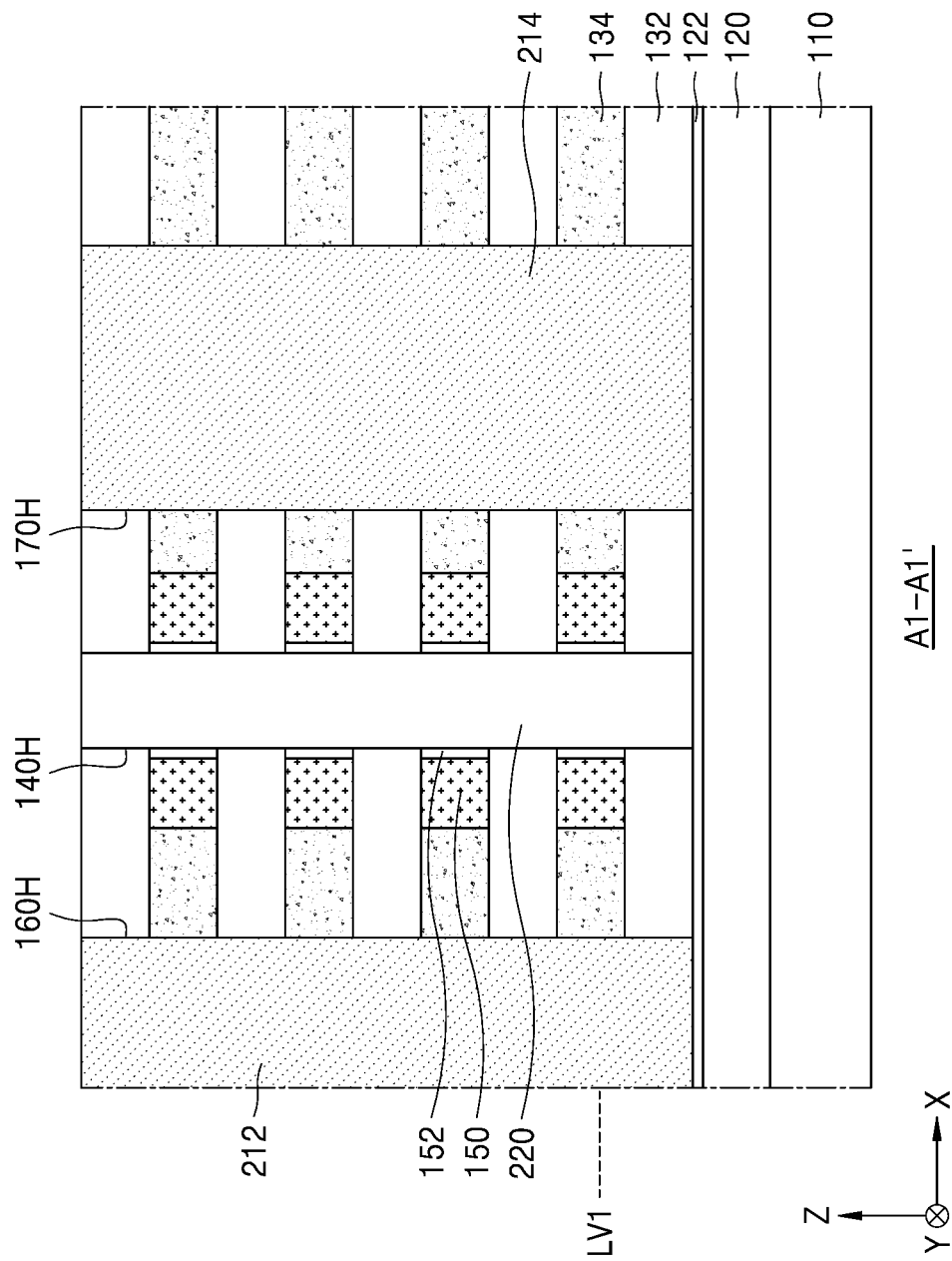
Figure 19B:
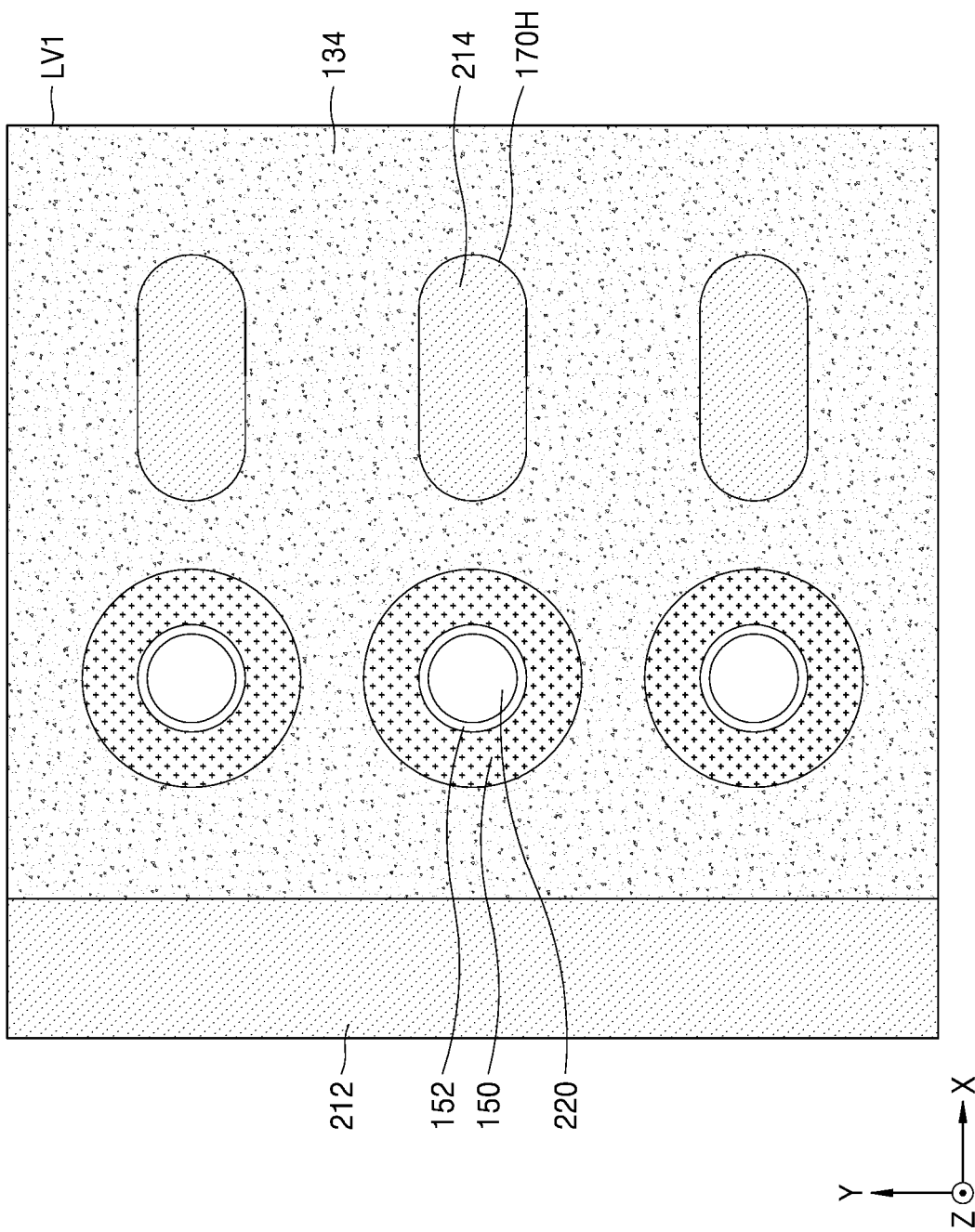

Referring to FIGS. 19A and 19B, the semiconductor pattern 150 may be formed on an inner wall of the expansion space 140EX. In some embodiments, the semiconductor pattern 150 may be formed by a CVD process, a PECVD process, or an ALD process.

Next, the gate insulating layer 152 may be formed on the inner wall of the semiconductor pattern 150. The gate insulating layer 152 may be formed by at least one of a thermal oxidation process, a CVD process, a PECVD process, or an ALD process. In some embodiments, the gate insulating layer 152 may be formed to cover or overlap only the inner wall of the semiconductor pattern 150. In some embodiments, the gate insulating layer 152 may be formed to cover or overlap both the inner wall of the semiconductor pattern 150 and an inner wall of the mold insulating layer 132.

Next, a third sacrificial filling layer 220 filled in the word line opening 140H may be formed. In some embodiments, the third sacrificial filling layer 220 may include silicon nitride.

Figure 20A:
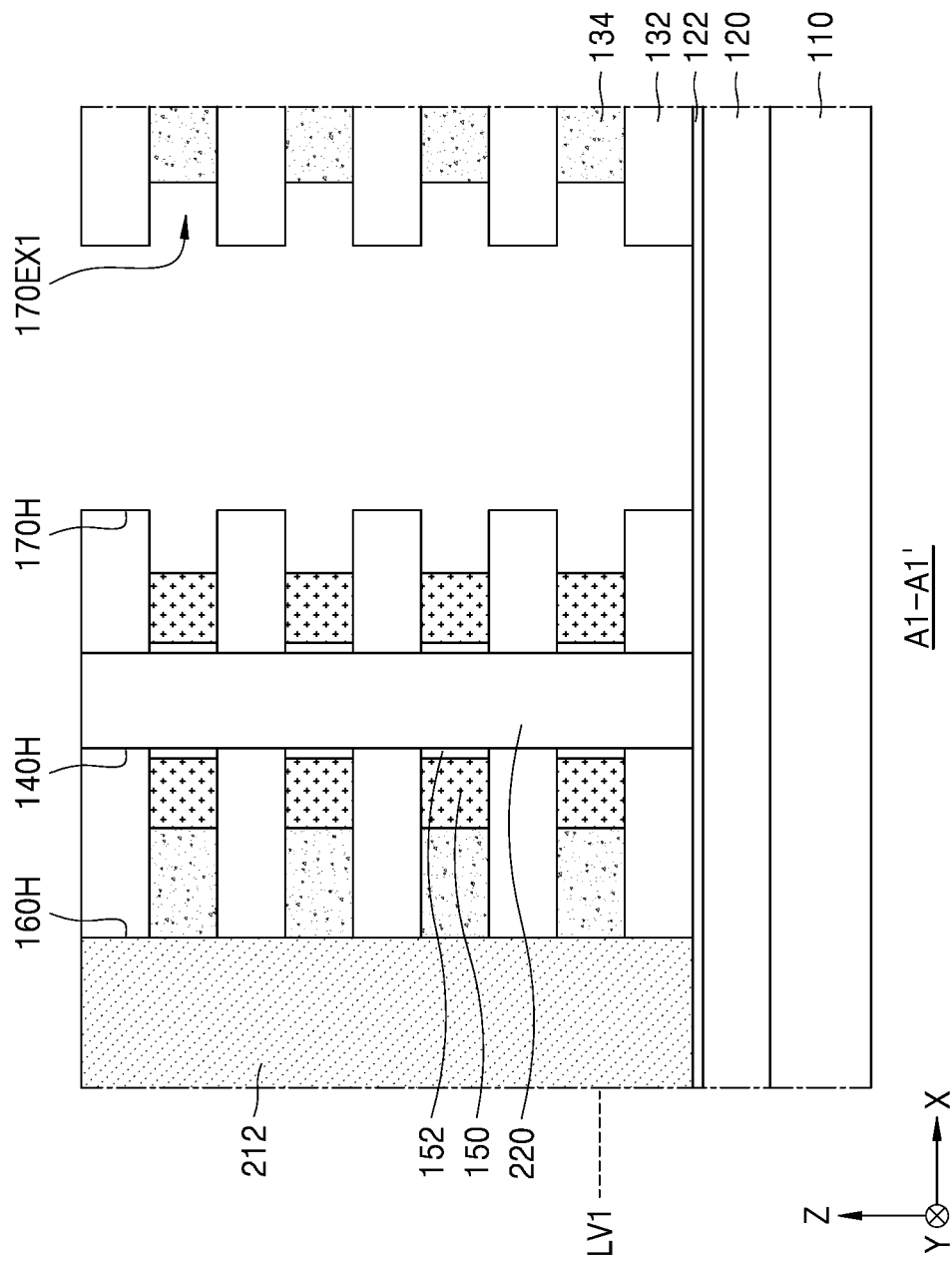
Figure 20B:
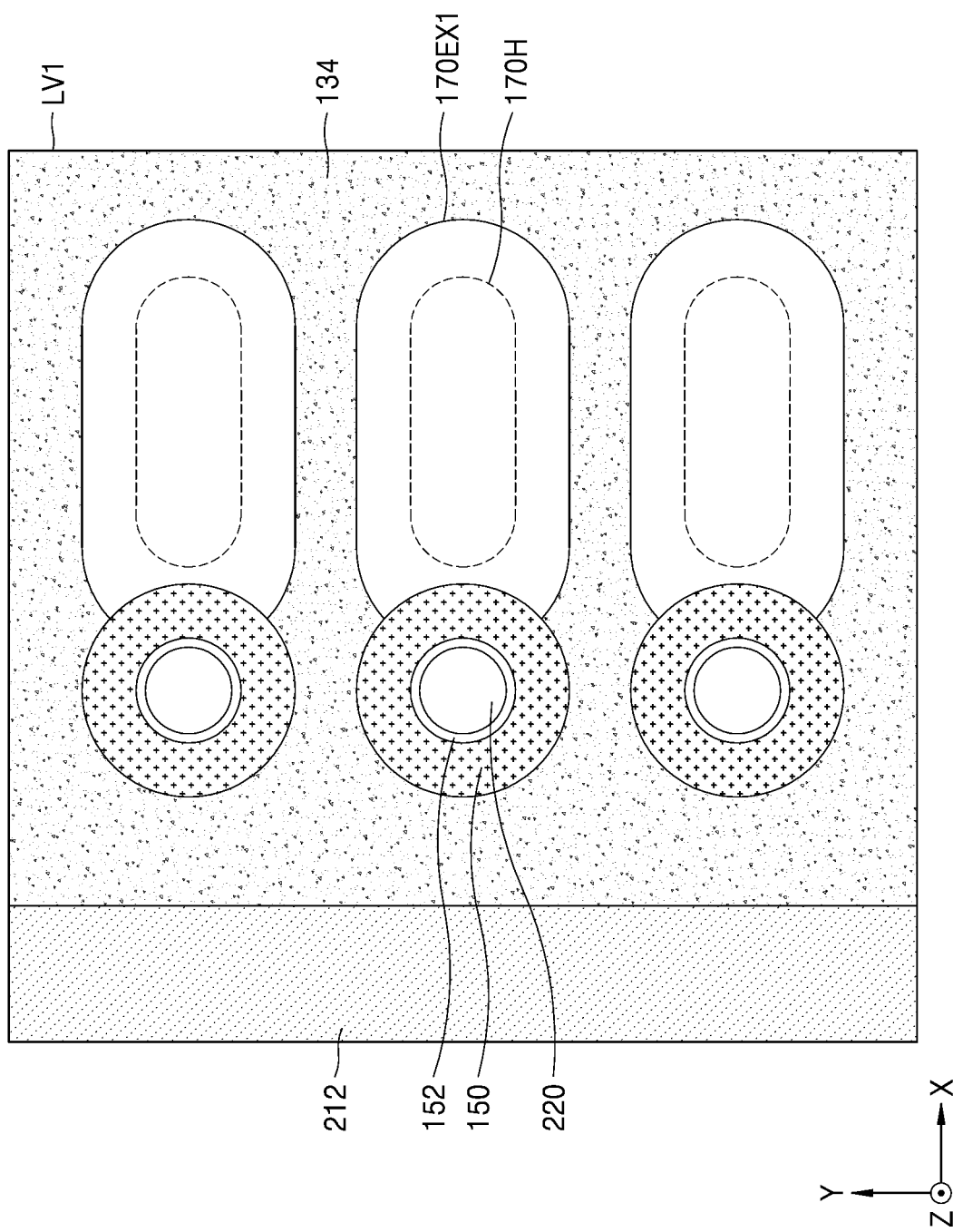

Referring to FIGS. 20A and 20B, the second sacrificial filling layer 214 may be removed, and the inner wall of the capacitor opening 170H may be exposed again.

Thereafter, a first expansion space 170EX1, which communicates with the capacitor opening 170H, may be formed by removing a part of the sacrificial insulating layer 134 exposed by the capacitor opening 170H. The first expansion space 170EX1 may expose a part of a sidewall of the semiconductor pattern 150.

Because the first expansion space 170EX1 is formed by removing the part of the sacrificial insulating layer 134 exposed by the capacitor opening 170H, the first expansion space 170EX1 may have an approximately constant width in the horizontal direction from the capacitor opening 170H. In some embodiments, the first expansion space 170EX1 may have a width of several tens of nanometers in the horizontal direction from the capacitor opening 170H. The height of the first expansion space 170EX1 may be substantially the same as the height of the sacrificial insulating layer 134. In some embodiments, the first expansion space 170EX1 may have a height of several tens of nanometers in the vertical direction Z.

Figure 21A:
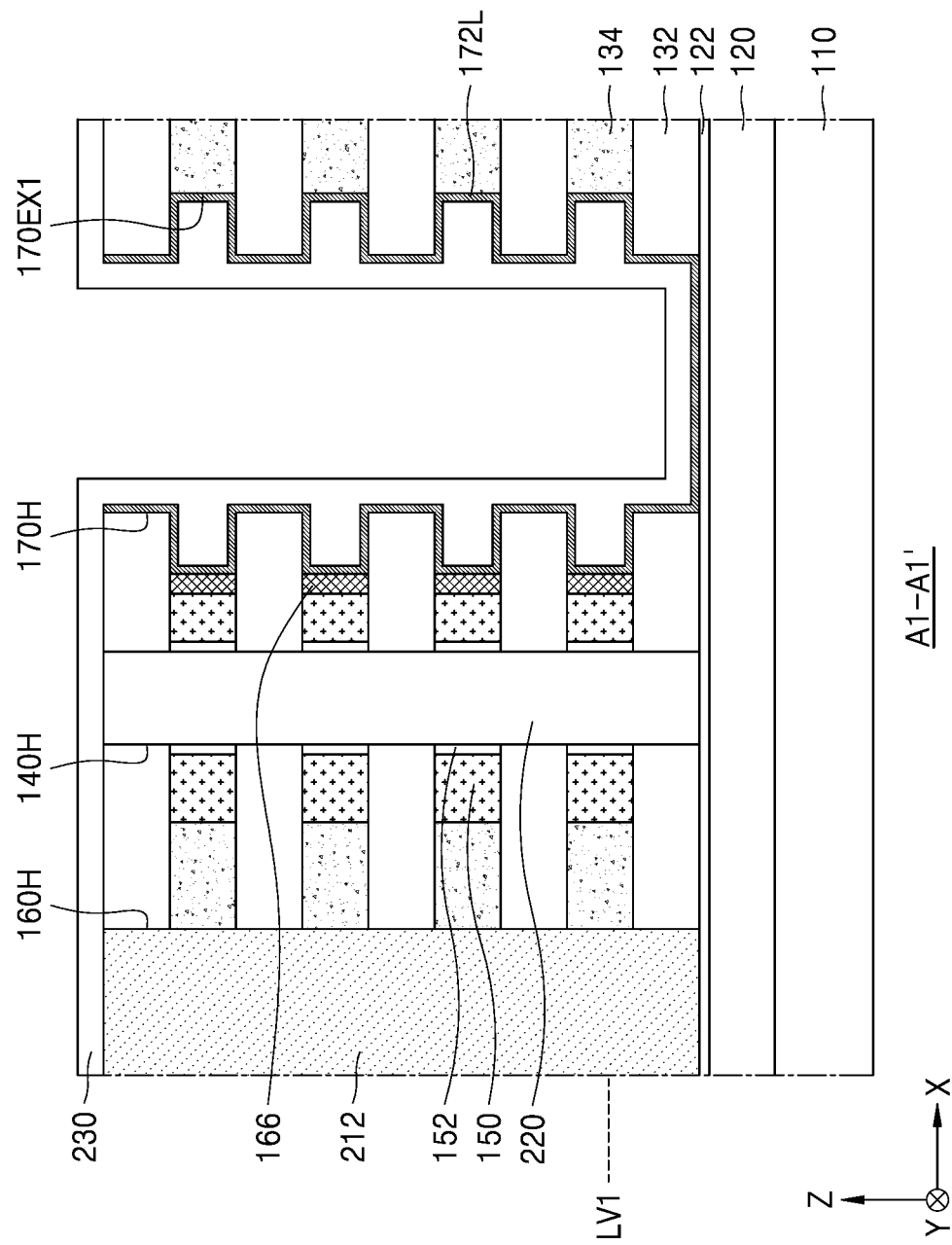
Figure 21B:
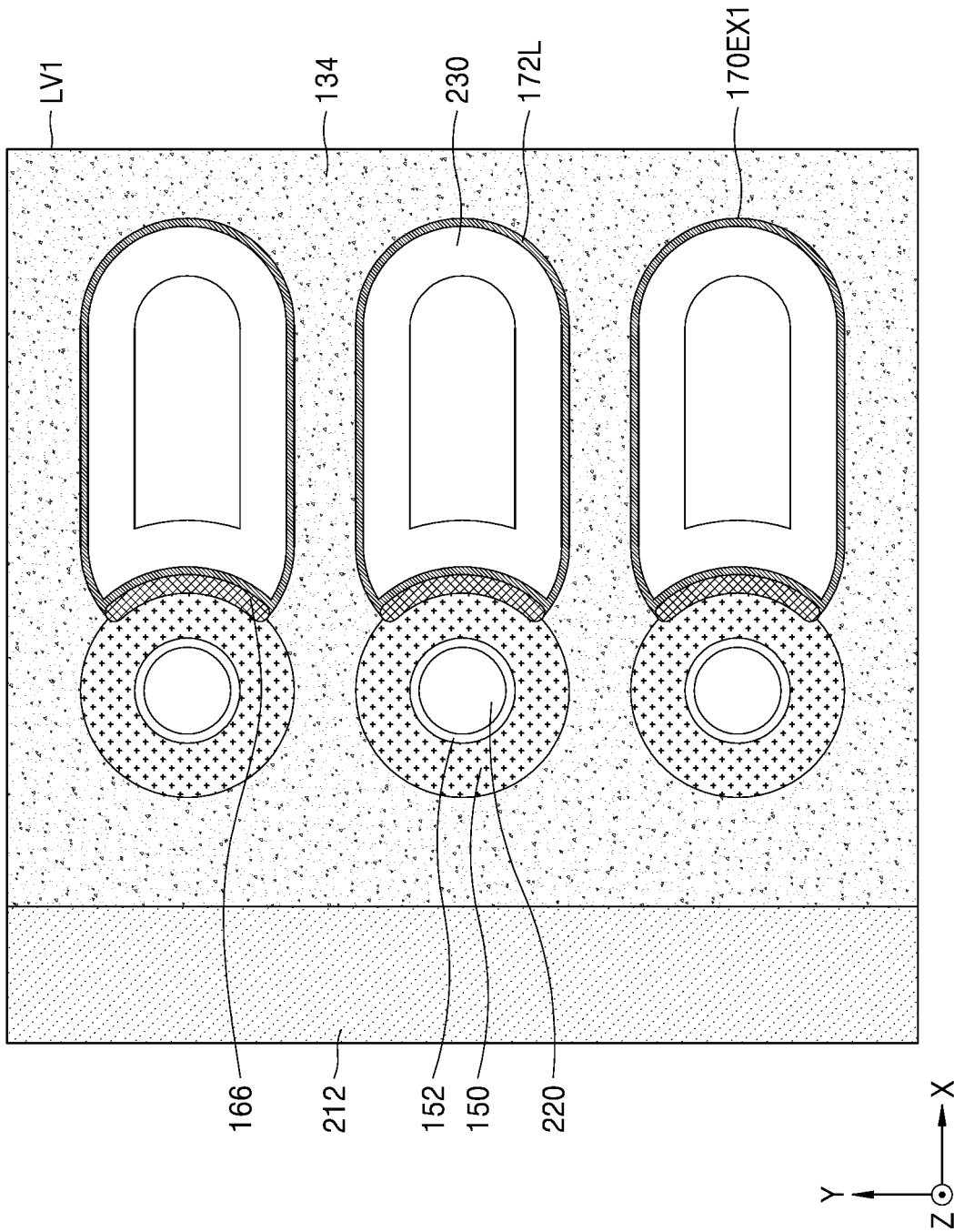

Referring to FIGS. 21A and 21B, the second impurity region 166 may be formed by injecting impurities on the sidewall of the semiconductor pattern 150 exposed in the first expansion space 170EX1.

Thereafter, a preliminary lower electrode layer 172L may be formed in the capacitor opening 170H and the first expansion space 170EX1, and a fourth sacrificial filling layer 230 may be formed on the preliminary lower electrode layer 172L.

For example, the preliminary lower electrode layer 172L may be conformally formed in the capacitor opening 170H and on the inner wall of the first expansion space 170EX1, and the fourth sacrificial filling layer 230 may be formed to a thickness sufficient to be completely filled inside the first expansion space 170EX1.

The first expansion space 170EX1 may have an aspect ratio of about 0.5 to 5 (e.g., a width in a horizontal direction to a height in the vertical direction Z is 0.5 to 5), and accordingly, a difficulty of a process of forming the second impurity region 166 in the first expansion space 170EX1 and/or a process of forming the preliminary lower electrode layer 172L in the first expansion space 170EX1 may be reduced.

Figure 22A:
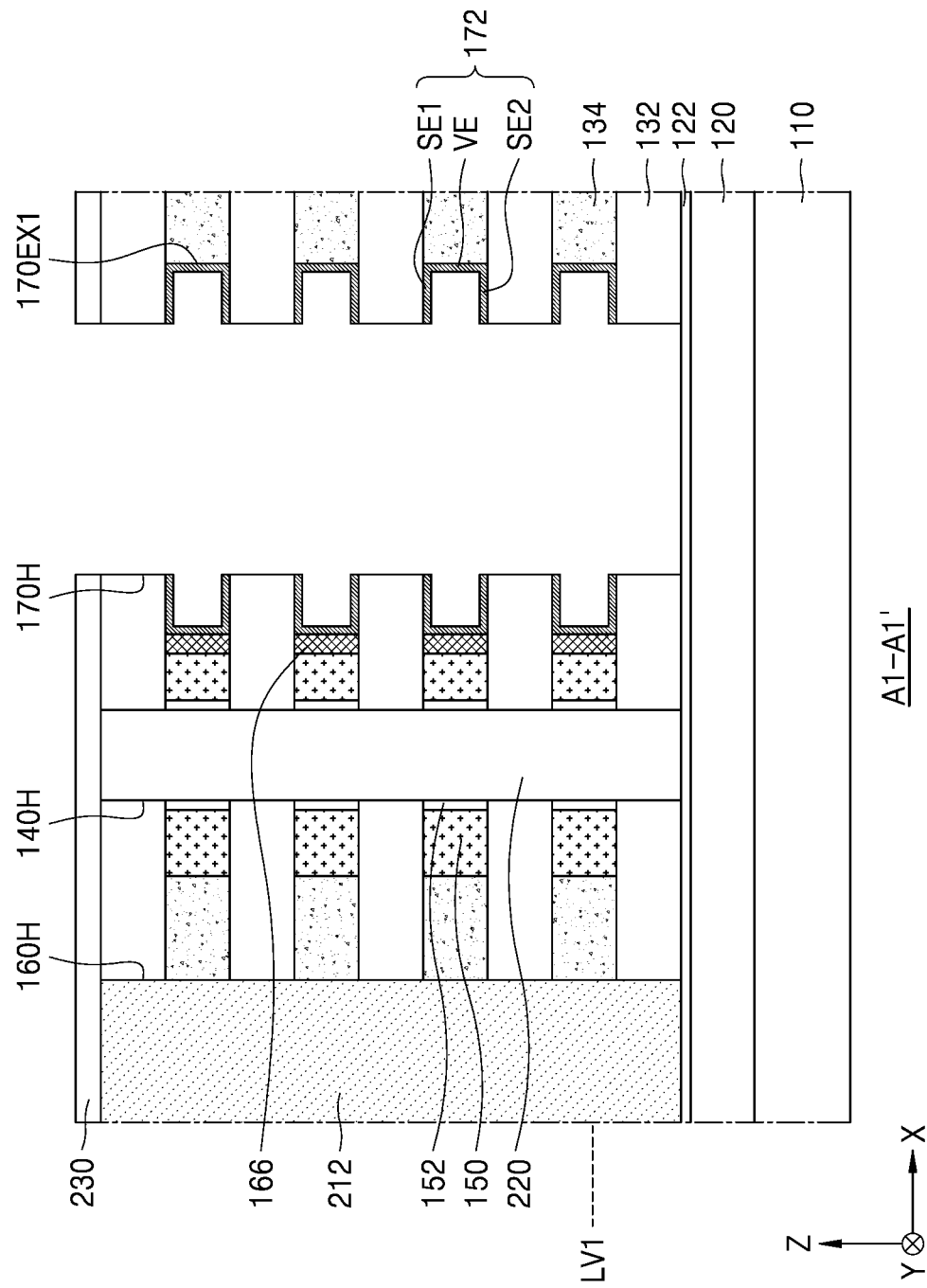

Referring to FIGS. 22A and 22B, the plurality of lower electrode layers 172 may be formed in the plurality of first expansion spaces 170EX1 by removing a part of the preliminary lower electrode layer 172L disposed on the inner wall of the capacitor opening 170H (or a part of the preliminary lower electrode layer 172L disposed on the sidewall of the mold insulating layer 132) and remaining a part of the preliminary lower electrode layer 172L inside the first expansion space 170EX1.

The plurality of lower electrode layers 172 may have a U-shaped vertical cross-section rotated by 90 degrees, and may include the connector VE extending in the vertical direction Z, the first segment SE1 extending in the horizontal direction from an upper end or an upper portion of the connector VE, and the second segment SE2 extending in the horizontal direction from a lower end or a lower portion of the connector VE.

Thereafter, a part of the fourth sacrificial filling layer 230 disposed inside the first expansion space 170EX1 may also be removed. Accordingly, an inner wall of the connector VE, a bottom surface of the first segment SE1, and a top surface of the second segment SE2 may be exposed in the inside of the first expansion space 170EX1, and a top surface of the first segment SE1 and a bottom surface of the second segment SE2 may be covered or overlapped by the mold insulating layer 132 and not be exposed in the inside of the first expansion space 170EX1.

Figure 23A:
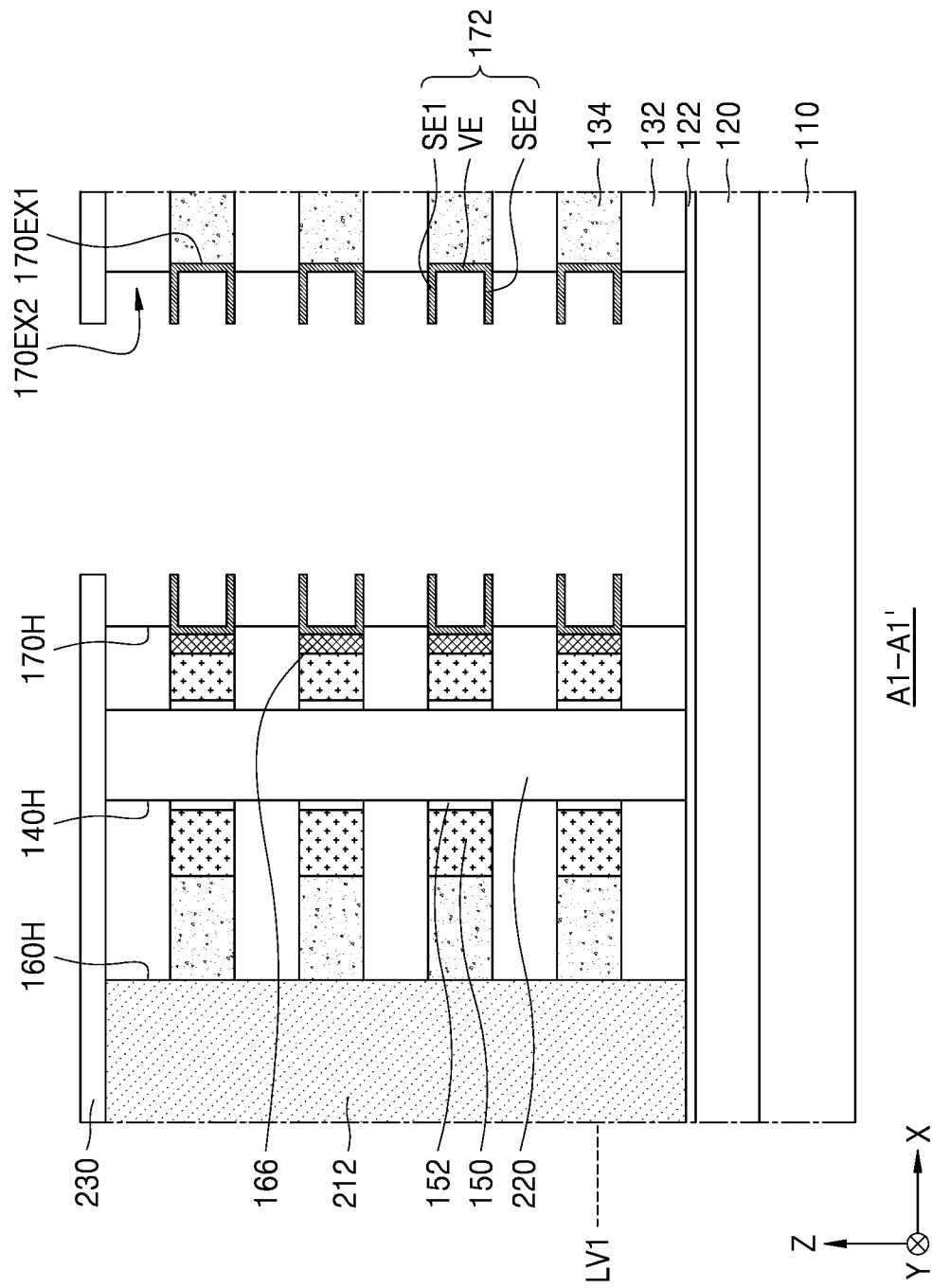
Figure 23B:
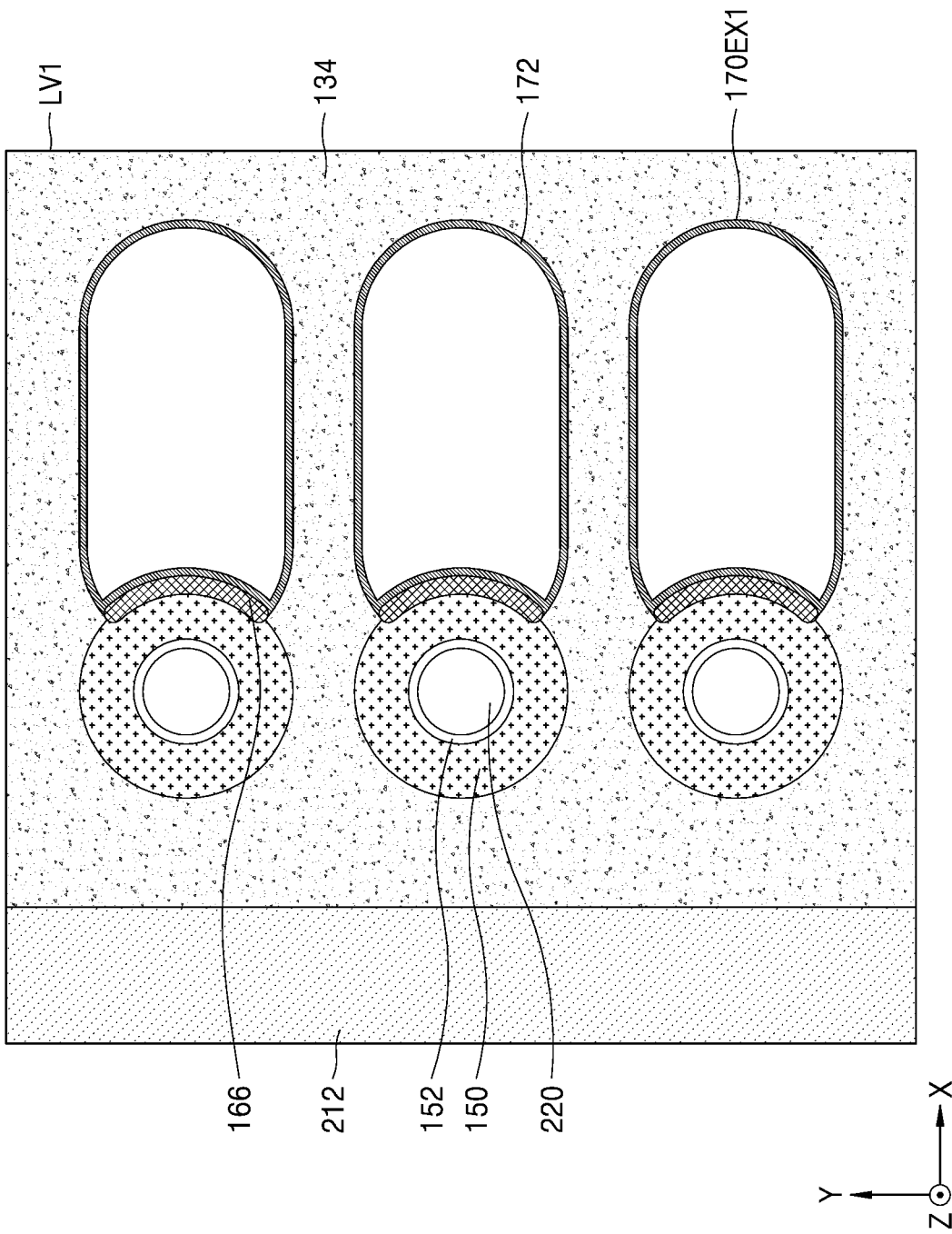

Referring to FIGS. 23A and 23B, a second expansion space 170EX2, which communicates with the capacitor opening 170H, may be formed by removing a part of the mold insulating layer 132 exposed through the capacitor opening 170H. The top surface of the first segment SE1 and the bottom surface of the second segment SE2 may be exposed in the inside of the second expansion space 170EX2.

Because the second expansion space 170EX2 is formed by removing a part of the mold insulating layer 132 exposed through the capacitor opening 170H, a width of the second expansion space 170EX2 in the horizontal direction from the capacitor opening 170H may have an approximately constant value. In some embodiments, the second expansion space 170EX2 may have a width of several tens of nm in the horizontal direction from the capacitor opening 170H. A height of the second expansion space 170EX2 may be substantially the same as the height of the mold insulating layer 132. In some embodiments, the second expansion space 170EX2 may have a height of several tens of nm in the vertical direction Z.

In some embodiments, a horizontal width of the second expansion space 170EX2 may be less than or equal to a horizontal width of the first expansion space 170EX1. For example, as the horizontal width of the second expansion space 170EX2 is less than or equal to the horizontal width of the first expansion space 170EX1, the connector VE of the lower electrode layer 172 or the second impurity region 166 may not be exposed by the second expansion space 170EX2.

Figure 24A:
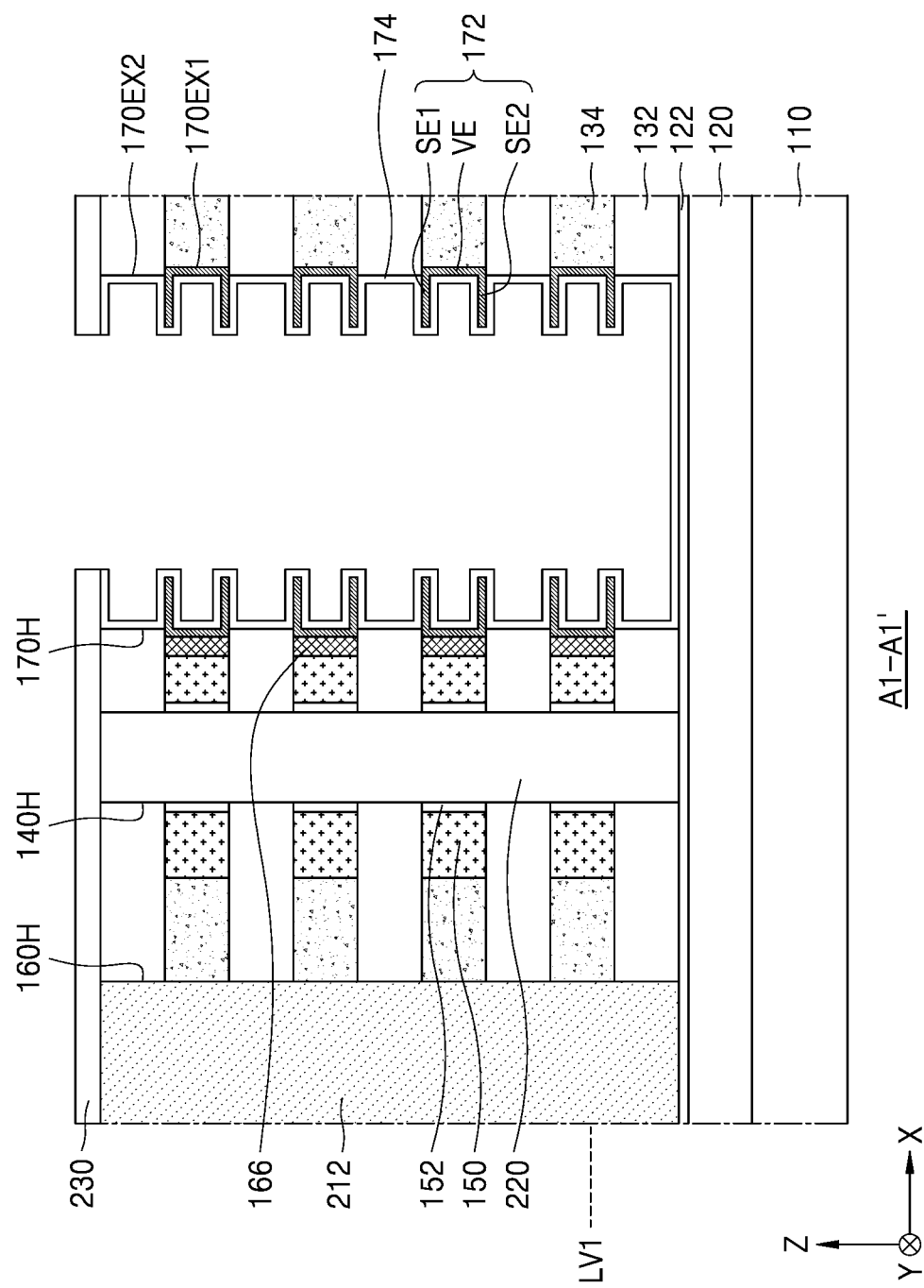
Figure 24B:
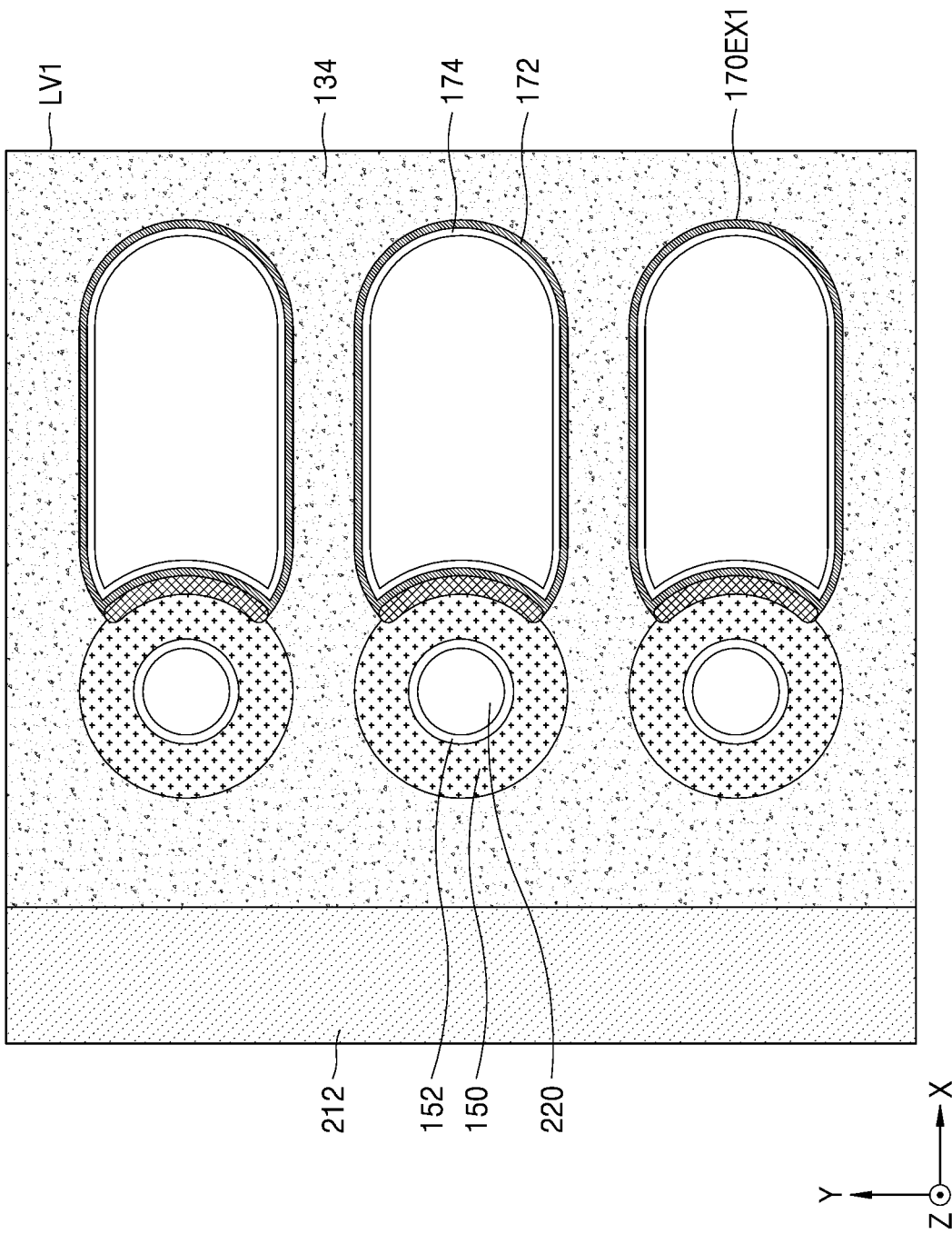

Referring to FIGS. 24A and 24B, the capacitor dielectric layer 174 may be formed on inner walls of the capacitor opening 170H, the first expansion space 170EX1, and the second expansion space 170EX2.

In some embodiments, the capacitor dielectric layer 174 may be formed conformally to a certain thickness on the top surface and the bottom surface of the first segment SE1, the inner wall of the connector VE, the top surface and the bottom surface of the second segment SE2, and the inner wall of the mold insulating layer 132.

Figure 25A:
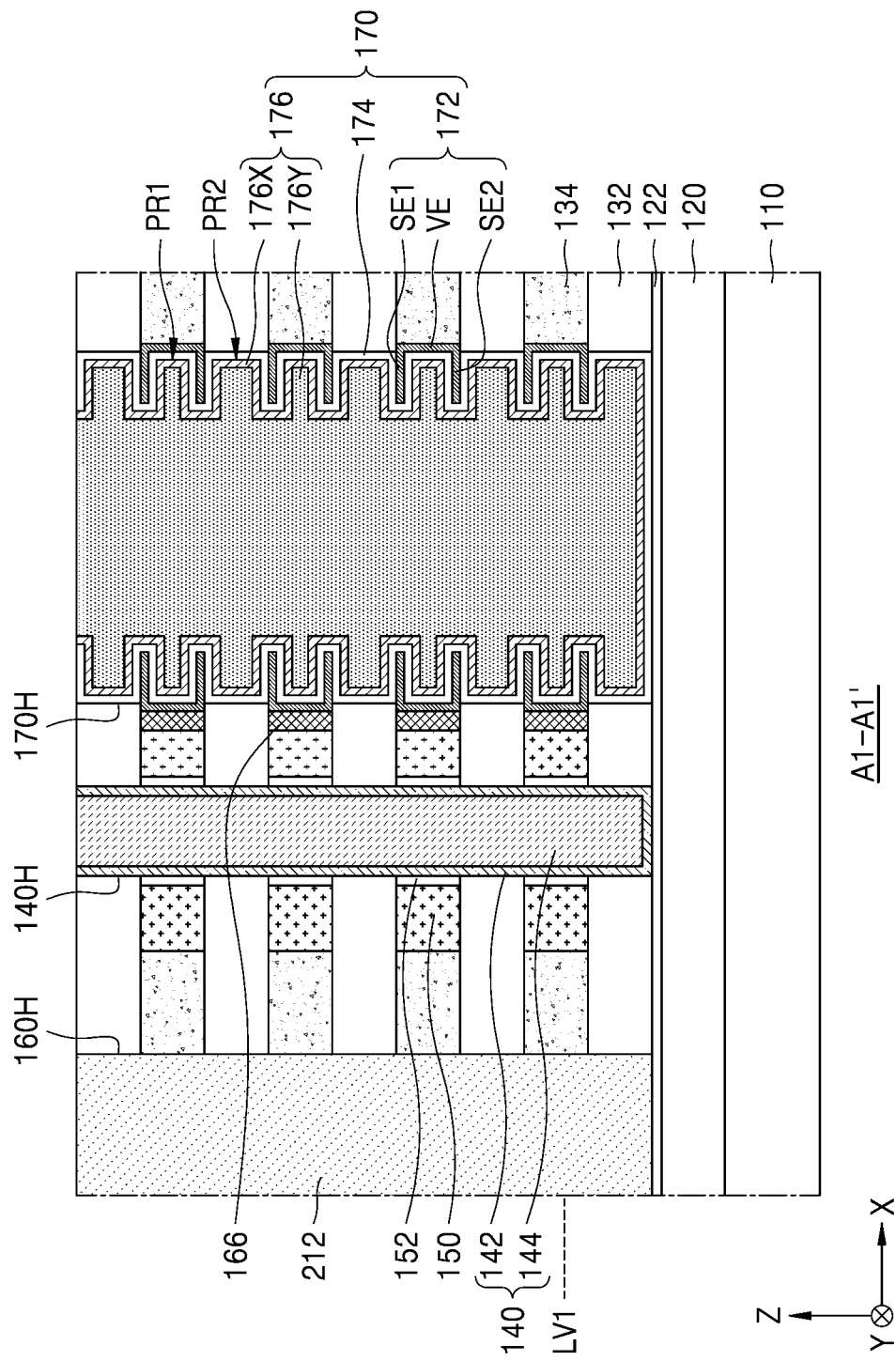
Figure 25B:
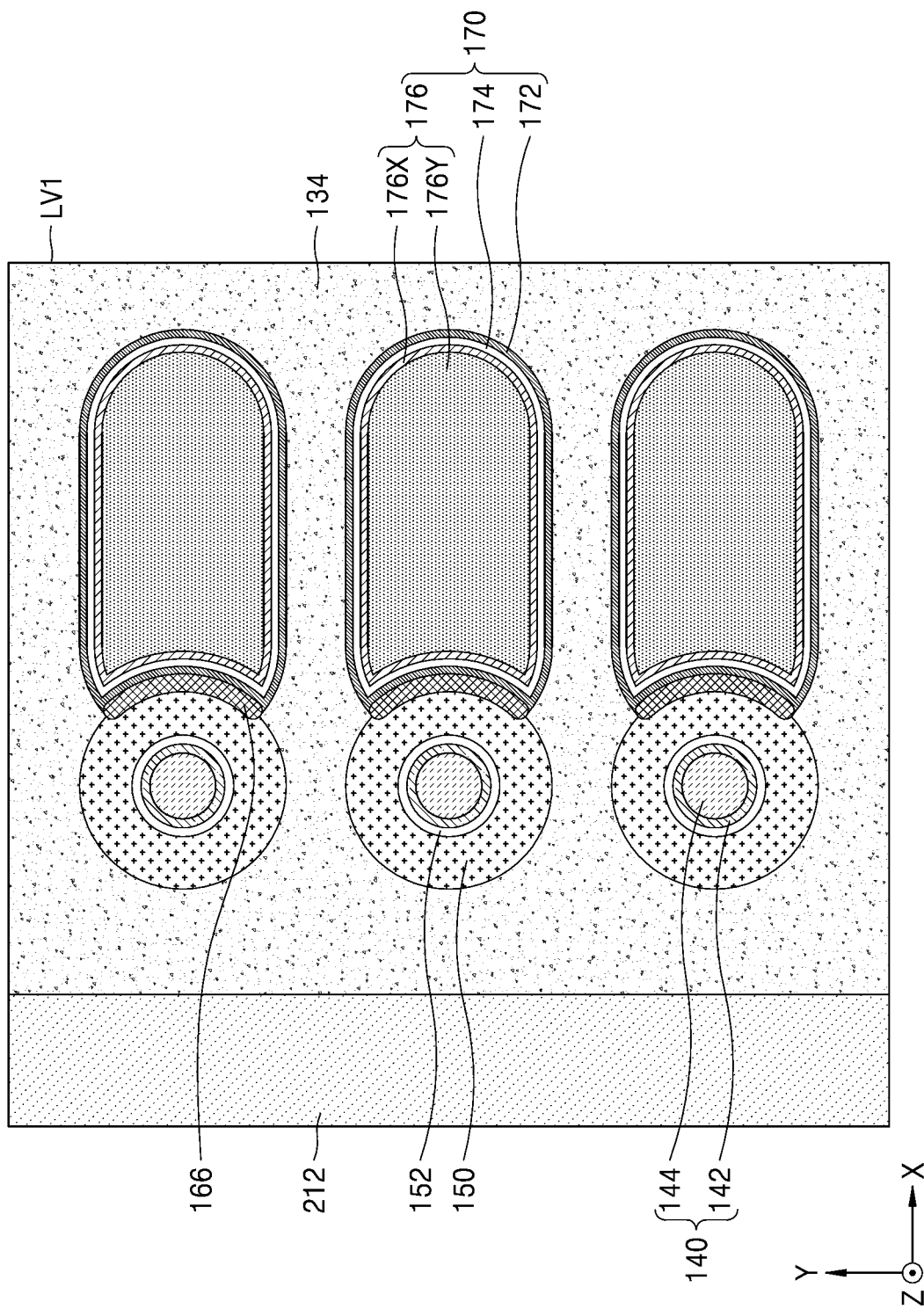

Referring to FIGS. 25A and 25B, the upper electrode layer 176 filled in the inside of the capacitor opening 170H, the first expansion space 170EX1, and the second expansion space 170EX2 may be formed. For example, the upper electrode layer 176 may be formed by sequentially forming the first upper electrode layer 176X and the second upper electrode layer 176Y on the inner walls of the capacitor opening 170H, the first expansion space 170EX1, and the second expansion space 170EX2.

Then, the third sacrificial filling layer 220 may be removed to expose the word line opening 140H again. The word line 140 filled in the inside of the word line opening 140H may be formed. For example, the word line 140 may be formed by sequentially forming the conductive barrier layer 142 and the conductive filling layer 144 on the inner wall of the word line opening 140H.

In some embodiments, the upper electrode layer 176 and the word line 140 may be formed during the same process. In this case, the conductive barrier layer 142 and the first upper electrode layer 176X may be simultaneously formed, and the conductive filling layer 144 and the second upper electrode layer 176Y may be simultaneously formed.

Figure 26A:
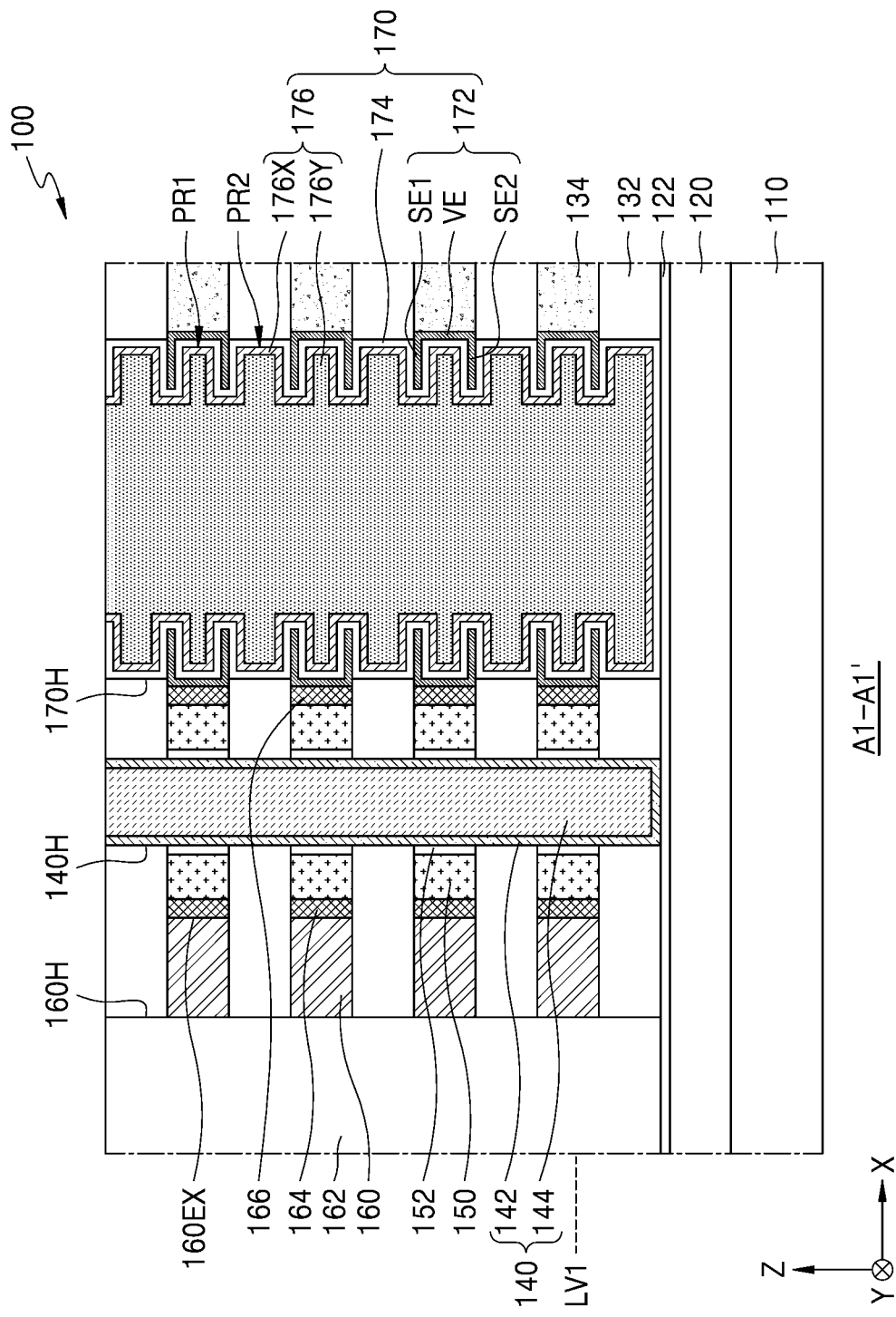
Figure 26B:
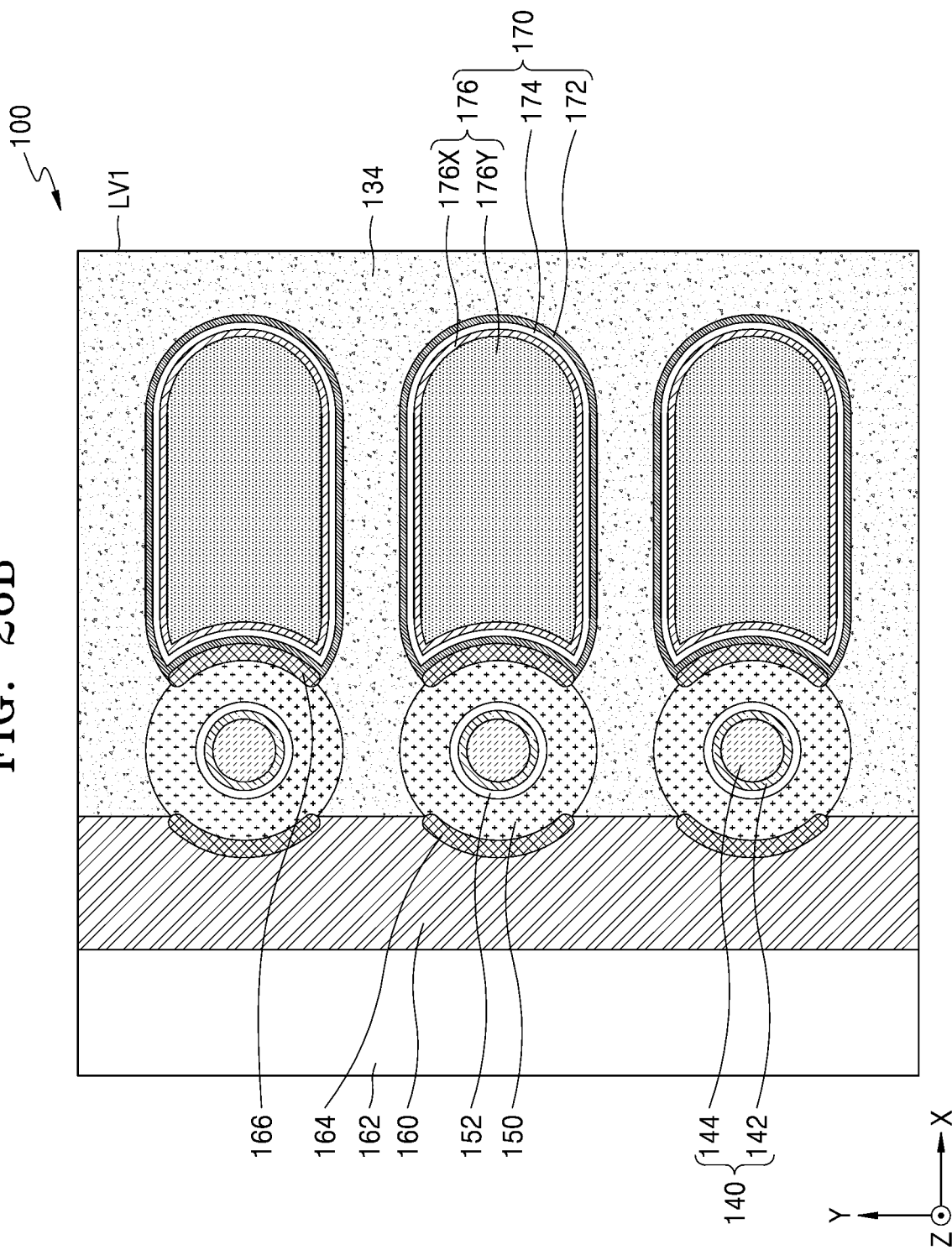

Referring to FIGS. 26A and 26B, the first sacrificial filling layer 212 may be removed and the inner wall of the bit line opening 160H may be exposed again.

Thereafter, a bit line space 160EX communicating with the bit line opening 160H may be formed by removing a part of the sacrificial insulating layer 134 exposed by the bit line opening 160H.

The bit line space 160EX may be formed by removing a part of the sacrificial insulating layer 134 adjacent to the bit line opening 160H so that a part of the sidewall of each of the semiconductor pattern 150 is exposed.

Thereafter, the first impurity region 164 may be formed by injecting impurities on the surface of the semiconductor pattern 150 exposed on the inner wall of the bit line space 160EX.

Thereafter, the bit line opening 160H and the inside of the bit line space 160EX may be filled with a conductive material, and the bit line 160 may be formed in the bit line space 160EX by etching back the conductive material to expose the inner wall of the bit line opening 160H. Thereafter, the bit line insulating layer 162 filled in the inside of the bit line opening 160H may be formed.

By performing the above-described process, the semiconductor memory device 100 may be completely formed.

According to a method of manufacturing a semiconductor memory device according to the comparative example, as shown in the structure illustrated in FIG. 22A, in a state where the inner wall of the connector VE, the bottom surface of the first segment SE1, and the top surface of the second segment SE2 are exposed by the inside of the first expansion space 170EX1, and the top surface of the first segment SE1 and the bottom surface of the second segment SE2 are covered or overlapped by the mold insulating layer 132 and are not exposed by the inside of the first expansion space 170EX1, the capacitor dielectric layer 174 and the upper electrode layer 176 are formed. Accordingly, an effective electrode area of a lower electrode layer capable of affecting capacitance is relatively small.

However, in example embodiments, the second expansion space 170EX2 may be formed by removing a part of the mold insulating layer 132 exposed on the inner wall of the capacitor opening 170H. Accordingly, the top surface of the first segment SE1 and the bottom surface of the second segment SE2 of the lower electrode layer 172 may act as additional effective electrode areas due to the formation of the second expansion space 170EX2. Accordingly, the capacitor structure 170 may have a relatively high capacitance, and the semiconductor memory device 100 may have an increased memory capacity.

While the inventive concept has been particularly shown and described with reference to embodiments thereof, it will be understood that various changes in form and details may be made therein without departing from the spirit and scope of the following claims.

What is claimed is:

1. A semiconductor memory device comprising:
a word line extending in a vertical direction on a substrate;
a semiconductor pattern having a ring-shaped horizontal cross-section and that extends around the word line in a plan view;
a bit line adjacent a first end of the semiconductor pattern in a first horizontal direction and extending in a second horizontal direction perpendicular to the first horizontal direction; and
a capacitor structure adjacent a second end opposite to the first end of the semiconductor pattern in the first horizontal direction,
wherein the capacitor structure comprises a lower electrode layer electrically connected to the semiconductor pattern, having a ring-shaped horizontal cross-section, and comprising a connector extending in the vertical direction, a first segment extending in a horizontal direction from an upper portion of the connector, and a second segment extending in the horizontal direction from a lower portion of the connector;
an upper electrode layer that extends in the vertical direction, wherein the upper electrode layer is on top and bottom surfaces of the first segment of the lower electrode layer, is on top and bottom surfaces of the second segment of the lower electrode layer, and is on an inner wall of the connector; and
a capacitor dielectric layer between the lower electrode layer and the upper electrode layer.

2. The semiconductor memory device of claim 1,
wherein the upper electrode layer comprises a first protrusion that protrudes toward the lower electrode layer, and a lower surface of a second protrusion at a vertical level higher than the first protrusion with respect to the substrate.

3. The semiconductor memory device of claim 2,
wherein the first protrusion of the upper electrode layer is in a space defined by the inner wall of the connector, the bottom surface of the first segment, and the top surface of the second segment of the lower electrode layer, and wherein the second protrusion of the upper electrode layer vertically overlaps the first protrusion and the top surface of the first segment of the lower electrode layer.

4. The semiconductor memory device of claim 2,
wherein the first protrusion of the upper electrode layer has a first width in the first horizontal direction, and
wherein the second protrusion of the upper electrode layer has a second width that is equal to or less than the first width in the first horizontal direction.

5. The semiconductor memory device of claim 2, wherein the capacitor dielectric layer conformally overlaps a surface of the first protrusion of the upper electrode layer and a surface of the second protrusion of the upper electrode layer.

6. The semiconductor memory device of claim 1, wherein the lower electrode layer has a U-shaped vertical cross-section.

7. The semiconductor memory device of claim 1, further comprising:
a first impurity region in the semiconductor pattern between the first end of the semiconductor pattern and the bit line; and
a second impurity region in the semiconductor pattern between the second end of the semiconductor pattern and the connector of the lower electrode layer.

8. The semiconductor memory device of claim 1,
wherein the first segment has a first width in the second horizontal direction,
wherein the connector has a first height in the vertical direction, and
wherein a ratio of the first width with respect to the first height is in a range of 0.5 to 5.

9. A semiconductor memory device comprising:
a word line extending in a vertical direction on a substrate;
a plurality of semiconductor patterns on the substrate, and each having a ring-shaped horizontal cross-section that extends around the word line in a plan view, wherein the plurality of semiconductor patterns are spaced apart from each other in the vertical direction;
a plurality of mold insulating layers on the word line, spaced apart from each other in the vertical direction, and alternately arranged with the plurality of semiconductor patterns;
a plurality of bit lines at respective first ends of the plurality of semiconductor patterns in a first horizontal direction, spaced apart from each other in the vertical direction, and extending in a second horizontal direction perpendicular to the first horizontal direction; and
a capacitor structure at second ends that are opposite to the respective first ends of the plurality of semiconductor patterns in the first horizontal direction,
wherein the capacitor structure comprises a plurality of lower electrode layers electrically connected to respective ones of the plurality of semiconductor patterns, each of the plurality of lower electrode layers having a ring-shaped horizontal cross-section, and each of the plurality of lower electrode layers comprising a connector extending in the vertical direction, a first segment extending in a horizontal direction from an upper portion of the connector, and a second segment extending in the horizontal direction from a lower portion of the connector;
an upper electrode layer that extends in the vertical direction, wherein the upper electrode layer is on top and bottom surfaces each of the first segments of the plurality of lower electrode layers, is on top and bottom surfaces of each of the second segments of respective ones of the plurality of lower electrode layers, and is on an inner wall of each of the connectors of respective ones of the plurality of lower electrode layers; and a capacitor dielectric layer that extends between ones of the plurality of lower electrode layers and the upper electrode layer.

10. The semiconductor memory device of claim 9, wherein the upper electrode layer comprises a plurality of first protrusions, each of the plurality of first protrusions is in a space defined by the inner wall of the connector of a respective one of the plurality of lower electrode layers, the bottom surface of the first segment of a respective one of the plurality of lower electrode layers, and the top surface of the second segment of a respective one of the plurality of lower electrode layers, and wherein the upper electrode layer further comprises a plurality of second protrusions that protrude toward respective ones of the plurality of mold insulating layers.

11. The semiconductor memory device of claim 10, wherein the plurality of first protrusions of the upper electrode layer and the plurality of second protrusions of the upper electrode layer are alternately arranged in the vertical direction.

12. The semiconductor memory device of claim 10, wherein each of the plurality of first protrusions of the upper electrode layer has a first width in the first horizontal direction, and wherein each of the plurality of second protrusions of the upper electrode layer has a second width that is equal to or less than the first width in the first horizontal direction.

13. The semiconductor memory device of claim 10, wherein the capacitor dielectric layer conformally overlaps a surface of each of the plurality of first protrusions of the upper electrode layer and a surface of each of the plurality of second protrusions of the upper electrode layer.

14. The semiconductor memory device of claim 9, wherein the first segment of each of the plurality of lower electrode layers has a first width in the second horizontal direction, wherein the connector of each of the plurality of lower electrode layers has a first height in the vertical direction, and wherein a ratio of the first width with respect to the first height is 0.5 to 5.

15. The semiconductor memory device of claim 9, further comprising:

a plurality of first impurity regions, each of which is in a respective one of the plurality of semiconductor patterns and is between the first end of the respective one of the plurality of semiconductor patterns and a respective one of the plurality of bit lines; and a plurality of second impurity regions, each of which is in a respective one of the plurality of semiconductor patterns and is between the second end of the respective one of the plurality of semiconductor patterns and the connector of a respective one of the plurality of lower electrode layers.

16. The semiconductor memory device of claim 9, wherein a surface of each of the plurality of lower electrode layers that is opposite to the word line is surrounded by an air space in a plan view.

17. The semiconductor memory device of claim 9, further comprising:

a separation insulating layer extending in the first horizontal direction that bisects at least one of the word line or the upper electrode layer.

18. A semiconductor memory device comprising:

a word line extending in a vertical direction on a substrate;

a plurality of semiconductor patterns on the substrate, and each having a ring-shaped horizontal cross-section that extends around the word line in a plan view, wherein the plurality of semiconductor patterns are spaced apart from each other in the vertical direction;

a plurality of mold insulating layers on the word line, spaced apart from each other in the vertical direction, and alternately arranged with the plurality of semiconductor patterns;

a plurality of bit lines adjacent respective first ends of the plurality of semiconductor patterns in a first horizontal direction, spaced apart from each other in the vertical direction, and extending in a second horizontal direction perpendicular to the first horizontal direction; and a plurality of capacitor structures adjacent respective second ends opposite to the first ends of the plurality of semiconductor patterns in the first horizontal direction and spaced apart from each other in the vertical direction, wherein the plurality of capacitor structures comprises a plurality of lower electrode layers electrically connected to respective ones of the second ends of the plurality of semiconductor patterns and each of the plurality of lower electrode layers having a ring-shaped horizontal cross-section;

an upper electrode layer that extends in the vertical direction, and comprising a plurality of first protrusions that protrude toward respective ones of the plurality of lower electrode layers and a plurality of second protrusions that protrude toward respective ones of the plurality of mold insulating layers; and a capacitor dielectric layer that extends between ones of the plurality of lower electrode layers and the upper electrode layer.

19. The semiconductor memory device of claim 18, wherein each of the plurality of lower electrode layers comprises a connector extending in the vertical direction, a first segment extending in a horizontal direction from an upper portion of the connector, and a second segment extending in the horizontal direction from a lower portion of the connector, and wherein the upper electrode layer is on top and bottom surfaces of each of the first segments of the plurality of lower electrode layers, is on top and bottom surfaces of each of the second segments of the plurality of lower electrode layers, and is on an inner wall of each of the connectors of the plurality of lower electrode layers.

20. The semiconductor memory device of claim 19, further comprising:

a plurality of intermediate insulating layers that extend into respective ones of the capacitor structures such that the respective ones of the lower electrode layers have a double U-shaped cross-section.

* * * * *